(12) United States Patent
Bathurst et al.

(10) Patent No.: US 9,217,541 B2
(45) Date of Patent: Dec. 22, 2015

(54) STABILIZATION STRUCTURE INCLUDING SHEAR RELEASE POSTS

(71) Applicant: LuxVue Technology Corporation, Santa Clara, CA (US)

(72) Inventors: Stephen Bathurst, Lafayette, CA (US); Hsin-Hua Hu, Los Altos, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 232 days.

(21) Appl. No.: 13/894,332

(22) Filed: May 14, 2013

(65) Prior Publication Data

US 2014/0340900 A1 Nov. 20, 2014

(51) Int. Cl.
 *H01L 29/06* (2006.01)
 *F21K 99/00* (2010.01)
 *H01L 23/00* (2006.01)
 *H01L 33/00* (2010.01)

(52) U.S. Cl.
 CPC . *F21K 9/00* (2013.01); *H01L 24/00* (2013.01); *H01L 33/0095* (2013.01); *Y10T 29/49002* (2015.01)

(58) Field of Classification Search
 CPC ............ H01L 2924/00; H01L 33/0095; H01L 2924/1461; H01L 25/0753; H01L 33/0079
 USPC ............................. 257/723, 724, 513, 622, 88
 See application file for complete search history.

(56) References Cited

U.S. PATENT DOCUMENTS

| | | |
|---|---|---|
| 5,592,358 A | 1/1997 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,335,263 B1 | 1/2002 | Cheung et al. |
| 6,403,985 B1 | 6/2002 | Fan et al. |
| 6,420,242 B1 | 7/2002 | Cheung et al. |

(Continued)

FOREIGN PATENT DOCUMENTS

| | | |
|---|---|---|
| JP | 07-060675 A | 3/1995 |
| JP | 3406207 | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May-Jun. 2002, pp. 840-845.

(Continued)

*Primary Examiner* — S. V. Clark
(74) *Attorney, Agent, or Firm* — Blakely, Sokoloff, Taylor & Zafman LLP

(57) ABSTRACT

A stabilization structure includes a stabilization layer on a carrier substrate. The stabilization layer includes an array of staging cavities. An array of micro devices are within the array of staging cavities. Each micro device is laterally attached to a shear release post laterally extending from a sidewall of a staging cavity. A pressure is applied to the array of micro devices from the array of transfer heads to shear the array of micro devices off the shear release posts. The sheared off micro devices are picked up from the carrier substrate using the array of transfer heads.

14 Claims, 20 Drawing Sheets

(56) References Cited

U.S. PATENT DOCUMENTS

| | | | |
|---|---|---|---|
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |
| 6,878,607 B2 | 4/2005 | Inoue et al. | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,585,703 B2 | 9/2009 | Matsumura et al. | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,989,266 B2 | 8/2011 | Borthakur et al. | |
| 7,999,454 B2 | 8/2011 | Winters et al. | |
| 8,023,248 B2 | 9/2011 | Yonekura et al. | |
| 8,333,860 B1 | 12/2012 | Bibl et al. | |
| 8,349,116 B1 | 1/2013 | Bibl et al. | |
| 8,415,768 B1* | 4/2013 | Golda et al. | 257/619 |
| 8,933,433 B2* | 1/2015 | Higginson et al. | 257/14 |
| 2001/0029088 A1 | 10/2001 | Odajima et al. | |
| 2002/0076848 A1 | 6/2002 | Spooner et al. | |
| 2003/0010975 A1 | 1/2003 | Gibb et al. | |
| 2003/0177633 A1 | 9/2003 | Haji et al. | |
| 2004/0232439 A1 | 11/2004 | Gibb et al. | |
| 2005/0232728 A1 | 10/2005 | Rice et al. | |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0214299 A1 | 9/2006 | Fairchild et al. | |
| 2007/0048902 A1 | 3/2007 | Hiatt et al. | |
| 2007/0166851 A1 | 7/2007 | Tran et al. | |
| 2007/0194330 A1 | 8/2007 | Ibbetson et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0283190 A1 | 11/2008 | Papworth et al. | |
| 2008/0303038 A1 | 12/2008 | Grotsch et al. | |
| 2009/0068774 A1 | 3/2009 | Slater et al. | |
| 2009/0146303 A1 | 6/2009 | Kwon | |
| 2009/0303713 A1 | 12/2009 | Chang et al. | |
| 2009/0314991 A1 | 12/2009 | Cho et al. | |
| 2010/0024848 A1 | 2/2010 | Bower et al. | |
| 2010/0105172 A1 | 4/2010 | Li et al. | |
| 2010/0188794 A1 | 7/2010 | Park et al. | |
| 2010/0203659 A1 | 8/2010 | Akaike et al. | |
| 2010/0203661 A1 | 8/2010 | Hodota | |
| 2010/0276726 A1 | 11/2010 | Cho et al. | |
| 2011/0003410 A1 | 1/2011 | Tsay et al. | |
| 2011/0049540 A1 | 3/2011 | Wang et al. | |
| 2011/0151602 A1 | 6/2011 | Speier | |
| 2011/0159615 A1 | 6/2011 | Lai | |
| 2011/0210357 A1 | 9/2011 | Kaiser et al. | |
| 2012/0064642 A1 | 3/2012 | Huang et al. | |
| 2012/0134065 A1 | 5/2012 | Furuya et al. | |
| 2014/0084482 A1* | 3/2014 | Hu et al. | 257/774 |
| 2014/0159065 A1* | 6/2014 | Hu et al. | 257/88 |
| 2014/0159066 A1* | 6/2014 | Hu et al. | 257/88 |
| 2014/0363928 A1* | 12/2014 | Hu et al. | 438/125 |
| 2015/0179877 A1* | 6/2015 | Hu et al. | 977/762 |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-186829 A | 8/2010 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

"Cyclotene Advanced Electronic Resins—Processing Procedures for BCB Adhesion," The Dow Chemical Company, Revised Jun. 2007, pp. 1-10.

(56) References Cited

OTHER PUBLICATIONS

Niklaus, et al., "Low-temperature full wafer adhesive bonding," Institute of Physics Bonding, Journal of Micromechanics and Microengineering, vol. 11, 2001, pp. 100-107.

Wohrmann, et al., "Low Temperature Cure of BCB and the Influence on the Mechanical Stress," 2011 Electronic Components and Technology Conference, pp. 392-400.

* cited by examiner

STABILIZATION STRUCTURE INCLUDING SHEAR RELEASE POSTS

FIELD

Embodiments as described herein relate generally to micro devices, and more specifically, to stabilization and transfer of micro devices.

BACKGROUND

Integration and packaging issues are one of the main obstacles for the commercialization of micro devices e.g., radio frequency (RF) microelectromechanical systems (MEMS) microswitches, light-emitting diode (LED) display systems, MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

Another existing technique for transferring semiconductor die uses elastomeric stamps. In this technique the surface of the stamp adheres to the surface of the semiconductor die via van der Waals forces.

SUMMARY

Methods and structures for stabilizing and transferring an array of micro devices are described. In an embodiment, stabilization structure includes a stabilization layer on a carrier substrate. The stabilization layer includes an array of staging cavities, and an array of micro devices such as, but not limited to, micro light emitting diode (LED) devices or micro chips are within the array of staging cavities with each micro device being laterally attached to a shear release post laterally extending from a sidewall of a corresponding staging cavity. The stabilization layer may be formed of a variety of materials. In an embodiment, the stabilization layer is formed of a thermoset material such as, but not limited to, benzocyclobutene (BCB). The shear release posts may be formed in a variety of locations between micro devices, such as axially between adjacent micro devices or diagonally between adjacent micro devices.

Each micro device may be secured above a bottom surface of a respective staging cavity. In one embodiment, each micro device is embedded in a sacrificial release layer, which may be within the staging cavity. Sacrificial release layer may be formed from a material that can be selectively etched with respect to the micro devices or staging cavity, such as an oxide material. Upon removal of the sacrificial release layer, each micro device may be secured above and hang over an open space above a bottom surface of the respective staging cavity.

In accordance with some embodiments, each micro device may have a maximum width of 1 µm to 100 µm. Each micro device may be attached to a shear release post with an attachment area having a height that up to 50% of the height of the micro device. The micro devices may also be thicker than the sacrificial release layer.

In an embodiment, a method of forming a stabilization structure to place an array of micro devices in a condition to be transferred includes forming an array of micro devices over a handle substrate, depositing a sacrificial release layer over the array of micro devices, etching the sacrificial release layer to expose side surface portions of the array of micro devices, and forming a stabilization layer over the sacrificial release layer to contact the exposed side surface portions of the array of micro devices. The method may further include bonding the stabilization layer to a carrier substrate, and removing the handle substrate. The method may also further include, prior to depositing the sacrificial release layer, depositing a conductive layer on a device layer over the handle substrate, patterning the conductive layer, and patterning the device layer to form the array of micro devices.

In an embodiment, etching the sacrificial release layer to expose the side surface portions of the array of micro devices exposes less than 50% of a height of the micro devices. In an embodiment, the method further comprises patterning a mask layer over the sacrificial release layer to form openings between the micro devices, and isotropically etching (e.g. wet etching or vapor etching) the sacrificial release layer to expose the side surface portions of the micro devices. In an embodiment, the sacrificial release layer is anisotropically etched through the openings between the micro devices prior to isotropically etching the sacrificial release layer to expose the side surface portions of the micro devices.

In an embodiment, a method of transferring an array of micro devices includes contacting an array of micro devices (e.g. micro LED devices or micro chips) within an array of staging cavities on a carrier substrate with an array of transfer heads. Each micro device may be laterally attached to a shear release post laterally extending from a sidewall of a corresponding staging cavity. A pressure is applied to the array of micro devices from the array of transfer heads to shear the array of micro devices off the shear release posts, and the array of micro devices are picked up from the carrier substrate using the array of transfer heads. Shearing the array of micro devices from the shear release posts may result in moving the array of micro devices into the array of staging cavities. After picking up the array of micro devices, they may be released from the array of transfer heads to place the array of micro devices onto a receiving substrate. In one embodiment, the array of transfer heads may have a contact area smaller than a top surface area of the array of micro devices. In an embodiment, the array of micro devices are picked up by an electrostatic force.

Other features as described herein will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

FIG. 1D-2 shows an enlarged view of a portion of the structure depicted in FIG. 1D-1.

DETAILED DESCRIPTION

Figure 1A:
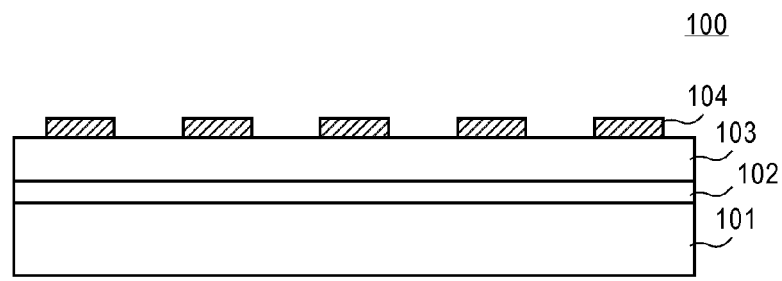
FIG. 1A is a cross-sectional view illustration of a structure including a patterned conductive layer over a handle substrate according to one embodiment of the invention.

Embodiments as described herein provide methods and structures for stabilizing and transferring an array of micro devices. In an embodiment, a stabilization structure includes a stabilization layer on a carrier substrate, and the stabilization layer includes an array of staging cavities. An array of micro devices is within the array of staging cavities, and each micro device is laterally attached to a shear release post laterally extending from a sidewall of a staging cavity. An array of shear release posts may be formed at a variety of locations between the array of micro devices in accordance with embodiments of the invention. For example, in one embodiment, a shear release post is formed axially between two adjacent micro devices. In another embodiment, a shear release post is formed diagonally between adjacent micro devices. For example, a shear release post may be diagonally between corners of four micro devices. In this manner a single sidewall can be shared by multiple micro devices. Furthermore, formation of sidewalls at the corners can allow for a higher density of micro devices on the carrier substrate.

In one embodiment, an array of micro devices is formed over a handle substrate, such as a growth substrate. A sacrificial release layer is deposited over the array of micro devices, and openings are formed at predetermined locations in the sacrificial release layer between the micro devices. The sacrificial release layer is partially etched through the openings to expose side surface portions of the array of micro devices to form attachment areas. A stabilization layer is deposited over the sacrificial layer to contact the exposed side surface portions of the micro devices. In one embodiment, the openings in the sacrificial release layer are formed diagonally between the micro devices. In one embodiment, the openings in the sacrificial release layer are formed axially between the micro devices. In one aspect, the openings formed diagonally between the micro devices can be larger than the openings formed axially between the micro devices allowing greater tolerance for the lithography requirements and a higher density of micro devices on the carrier substrate.

In one embodiment, an array of micro devices within the array of staging cavities on a carrier substrate is contacted by an array of transfer heads. Each micro device is laterally attached to a shear release post laterally extending from a sidewall of a staging cavity. A pressure is applied to the array of micro devices from the array of transfer heads to shear the array of micro devices off the shear release posts. The micro devices are picked up from the carrier substrate using the array of transfer heads.

In one aspect, the pressure that is provided to shear the micro devices off of the shear release posts is a mechanical downward pressure provided by movement of the transfer head assembly rather than a gripping pressure generated by the transfer head assembly. Picking up or shearing off micro devices that are bonded to a carrier substrate, whether bonded to the carrier substrate by shear release posts or otherwise, requires sufficient application of pressure to break the bonds (e.g. covalent, van der Waals, etc.) between the micro devices and the carrier substrate. In accordance with embodiments of the invention, the bond strength between the carrier substrate and a micro device can be abated by decreasing the contact area between a shear release post and the micro device. Furthermore, the bond strength that must be overcome is abated by overcoming a shear strength as opposed to a tensile strength of the bond. In accordance with embodiments of the invention, it is not required to overcome this bond strength with the gripping pressure generated by the transfer head assembly. Accordingly, the pick up pressure required to pick up a sheared off micro device may be substantially smaller than the pick up pressure that would be required to pick of a micro device that is bonded to a carrier substrate, whether bonded to the carrier substrate by shear release posts or otherwise. In addition, the reduction in pick up pressure that is required to be generated by the transfer head assembly can be translated into a reduction in the contact area of the transfer heads. In an embodiment the contact area for the transfer heads is smaller than the top surface of the micro devices.

In another aspect, embodiments of the invention may be practiced with an array of transfer heads that operate in accordance with principles of electrostatic grippers, using the attraction of opposite charges to pick up micro devices. In such an embodiment, an operating voltage is applied to an electrostatic transfer head in order to generate the pick up pressure, or grip pressure on a micro device. In this manner, the pick up pressure (and consequently operating voltage) required by the array of electrostatic transfer heads to pick up the sheared off micro devices may be substantially smaller than the pick up pressure (and consequently operating voltage) that would be required to pick up the micro devices that are attached to the shear release posts. Because the pick up pressure required to pick up sheared off micro devices is reduced, the electrode area in the electrostatic transfer heads, and consequently the contact area of the transfer heads can be reduced. A reduced transfer head contact area may provide more alignment tolerance and simplify the positioning of the array of transfer heads over the array of micro devices. The lower operating voltage may also allow for the use of lower dielectric constant materials and a lower break down voltage for the electrostatic transfer heads. This may correlate to reduced manufacturing costs of the electrostatic transfer head assembly.

While some embodiments are described herein with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser). Other embodiments are described with specific regard to micro chips including circuitry. For example, the micro chips may be based on silicon or silicon on insulator (SOI) wafers for logic or memory applications, or based on GaAs wafers for RF communications applications.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" another layer may be directly in contact with the other layer or may have one or more intervening layers. One layer "between" layers may be directly in contact with the layers or may have one or more intervening layers.

The terms "micro" device, "micro" chip, or "micro" LED device as used herein may refer to the descriptive size of certain devices, chips, or structures in accordance with embodiments of the invention. As used herein the term "micro device" specifically includes, but is not limited to, "micro LED device" and "micro chip". As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a single micro device in an array of micro devices, and a single transfer head in an array of transfer heads both have a maximum dimension, for example length or width, of 1 to 100 μm. In an embodiment, the top contact surface of each micro device or transfer head has a maximum dimension of 1 to 100 μm, or more specifically 3 to 20 μm. In an embodiment, a pitch of an array of micro devices, and a corresponding array of transfer heads is (1 to 100 μm) by (1 to 100 μm), for example a 20 μm by 20 μm pitch or 5 μm by 5 μm pitch.

FIG. 1A is a cross-sectional side view illustration 100 of a structure including a patterned conductive layer over a handle substrate according to one embodiment of the invention. Contacts 104 are patterned on a device layer 103 over a handle substrate 101. Handle substrate 101 may be a variety of substrates, depending upon the particular micro device being formed. In an embodiment, the micro devices being formed are micro LED devices, and the handle substrate 101 is a growth substrate suitable for the growth of an active device layer. In an embodiment, the handle substrate 101 is a sapphire substrate, silicon substrate, or SiC substrate for the growth of blue emitting or green emitting LED device. In an embodiment, the handle substrate 101 is a gallium arsenide (GaAs) substrate for the growth of red emitting LED devices. A cap layer 102 may optionally be formed between the device layer 103 and handle substrate 101. For example, the optional cap layer 102 may function as an etch stop layer to aid in subsequent removal of the handle substrate 101. Optional cap layer 102 may also be a bulk semiconductor layer used in the formation of the active device layer 103. In an embodiment, the micro devices being formed are micro LED devices, and the active device layer 103 includes an n-doped layer, one or more quantum well layers, and a p-doped layer. For example, if the micro LED devices are designed to emit a red light (e.g. about 620-750 nanometers ("nm") wavelength), the device layer 103 may include a material such as aluminum gallium arsenide (AlGaAs), gallium arsenide phosphide (GaAsP), aluminum gallium indium phosphide (AlGaInP), and gallium phosphide (GaP). For example, if the micro LED devices are designed to emit a green light (e.g. about 495-570 nm wavelength) the device layer 103 may include a material such as indium gallium nitride (InGaN), gallium nitride (GaN), gallium phosphide (GaP), aluminum gallium indium phosphide (AlGaInP), and aluminum gallium phosphide (AlGaP). For example, if the micro LED devices are designed to emit a blue light (e.g. about 450-495 nm wavelength) the device layer 103 may include a material such as gallium nitride (GaN), indium gallium nitride (InGaN), and zinc selenide (ZnSe).

In an embodiment, the micro devices are micro chips, and the handle substrate 101 is a semiconductor substrate e.g., a bulk silicon substrate. For example, the device layer 103, optional cap layer 102, and handle substrate 101 may be a silicon-on-insulator (SOI) substrate with the device layer 103 including device quality silicon, the optional cap layer 102 is a buried oxide layer, and the handle substrate 101 is a bulk silicon substrate.

In an embodiment, the optional cap layer 102 is about 0.1-5 μm thick, and the device layer is about 1-20 μm thick. A conductive contact layer may be formed over the device layer 103 using a suitable technique such as sputtering or electron beam deposition followed by etching or liftoff to form the array of conductive contacts 104. In an embodiment, the array of conductive contacts have a thickness of approximately 0.1-2 μm, and can include a plurality of different layers. For example, a conductive contact 104 may include an electrode layer to provide an ohmic contact with the p-doped layer of the micro device, a mirror layer on the electrode layer, an adhesion/barrier layer on the mirror layer, a diffusion barrier layer on the adhesion/barrier layer, and a bonding layer on the diffusion barrier layer. In an embodiment, the bonding layer can form the outermost surface of conductive contact 104, and can be formed from a variety of materials for bonding to a receiving substrate. In other embodiments, a different arrangement of materials can be used for the different layers of the contacts 104.

In an embodiment, micro device 105 is a red-emitting p-n diode structure, and substrate 101 is formed of GaAs, and is approximately 500 μm thick. The optional cap layer 102 is an etch stop layer and can be formed of InGaP and be approximately 2,000 angstroms thick. The red-emitting p-n diode structure may include an approximately 500 angstroms thick GaAs ohmic layer on optional cap layer 102 in order to make electrical contact with top contacts 116 that are yet to be formed. An n-doped layer of AlGaInP can be formed on the ohmic layer of GaAs, and is approximately 1 μm to 3 μm thick. One or more quantum well layers can be formed on the n-doped layer of AlGaInP, and may have a thickness of approximately 0.5 μm. A p-doped layer of GaP can be formed on the one or more quantum well layers, and is approximately 1 μm to 2 μm thick.

In an embodiment, the electrode layer of conductive contact 104 is formed of a high work-function metal, e.g., nickel. In an embodiment, the mirror layer is formed of silver to reflect the transmission of the visible wavelength. In an embodiment, titanium is used as the adhesion/barrier layer, and platinum is used as the diffusion barrier to the bonding layer. The bonding layer may be formed of a variety of materials which can be chosen for bonding to the receiving substrate. Following the formation of contacts 104, the substrate stack can be annealed to form an ohmic contact. For example, a p-side ohmic contact may be formed by annealing the substrate stack at 510° C. for 10 minutes.

In an embodiment, the bonding layer of contact 104 is formed of a conductive material (both pure metals and alloys) which can diffuse with a metal forming a contact pad on a receiving substrate (e.g. silver, gold, indium, bismuth, tin contact pad). In one embodiment, if the bonding layer has a liquidus temperature below the annealing temperature for forming the p-side ohmic contact, the bonding layer is formed after annealing.

In an embodiment, the micro device 105 is a blue-emitting p-n diode structure, and handle substrate 101 is sapphire, silicon, or SiC, and device layer 103 is formed of GaN. In this embodiment, optional cap layer 102 is a buffer GaN layer grown between the handle substrate 101 and device layer 103. In this embodiment, device layer 103 includes an n-doped GaN layer on the buffer GaN layer, one or more quantum well layers on the n-doped GaN layer, and a p-doped GaN layer on the one or more quantum well layers. In an embodiment, the handle substrate 101 is approximately 200 μm thick, the buffer GaN layer is about 5 μm thick, n-doped layer is about 0.1-3 μm thick, the one or more quantum well layer are less than about 0.3 μm thick, and the p-doped layer is approximately 0.1-6 μm thick.

Figure 1B:
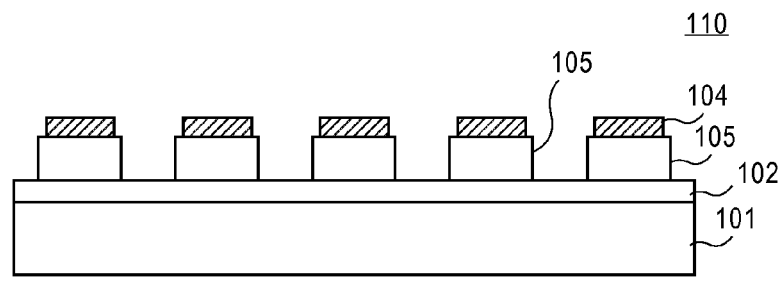
FIG. 1B is a cross-sectional side view similar to FIG. 1A after the device layer is patterned according to one embodiment of the invention.

FIG. 1B is a cross-sectional side view 110 similar to FIG. 1A after the device layer is patterned according to one embodiment of the invention. The device layer 103 is patterned to form an array of laterally separate micro devices 105. Patterning of the device layer 103 may be performed using a variety of etching methods, and may stop on the optional cap layer 102, which may be an etch stop layer or buffer layer as described above. The particular etching technique and chemistry may be selected for the particular materials. For example, dry etching techniques such as reactive ion etching (RIE), electro-cyclotron resonance (ECR), inductively coupled plasma reactive ion etching ICP-RIE, and chemically assisted ion-beam etching (CAIBE) may be used. The etching chemistries may be halogen based, containing species such as $Cl_2$, $BCl_3$, or $SiCl_4$. In an embodiment, the micro devices 105 are micro chips, and etching of the device layer 103 is performed using positive photoresist lithography, and a dry reactive ion etching ("DRIE") to form openings between the laterally separate micro chips. It is to be appreciated that other masking techniques may be used to form the openings, such as use of hard mask materials and negative photoresist.

Figure 1C:
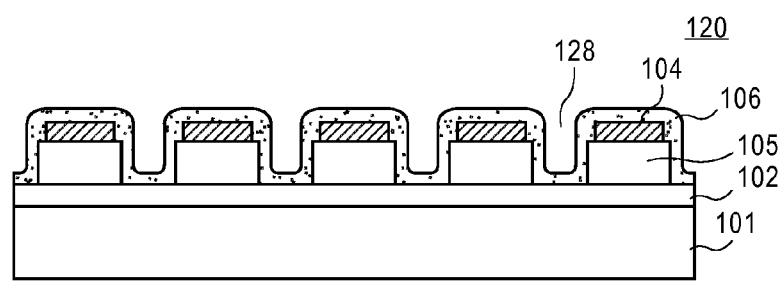
FIG. 1C is a cross-sectional side view similar to FIG. 1B after a sacrificial release layer is deposited over the array of micro devices according to one embodiment of the invention.

FIG. 1C is a cross-sectional side view 120 similar to FIG. 1B after a sacrificial release layer is deposited over the array of micro devices according to one embodiment of the invention. A sacrificial release layer 106 is deposited over the array of micro devices 105 and laterally between the micro devices. In an embodiment, the size of openings 128 between devices 105 corresponds to the size of the sidewalls of the staging cavities of a stabilization layer formed later on in a process. In one embodiment, the thickness of the sacrificial release layer 106 determines the depths of staging cavities. In an embodiment, the sacrificial release layer 106 is about 0.5-2 microns ("μm") thick. In one embodiment, the thickness of the sacrificial release layer 106 at least partially determines the height of the openings 128, which will become the stabilization structure sidewalls formed later on in a process. In one embodiment, the thickness of the array of conductive contacts 104 and device layer 103 can also contribute to the height of the openings 128, which will become the stabilization structure sidewalls formed later on in a process. In an embodiment, the sacrificial release layer 106 is formed of an electrically insulating material. In an embodiment, the sacrificial release layer 106 is formed of a material which can be readily and selectively removed with vapor (e.g. vapor HF) or plasma etching. In one embodiment, the sacrificial release layer 106 is an oxide layer (e.g. $SiO_2$). In other embodiments, the sacrificial release layer 106 is a nitride layer (e.g. $SiN_x$), or other insulating material layer. In an embodiment, the sacrificial release layer 106 is formed of silicon, for example, amorphous silicon or polysilicon. The sacrificial release layer can be deposited using any suitable technique such as physical vapor deposition (PVD), chemical vapor deposition (CVD), or evaporation techniques. In an embodiment, the sacrificial release layer is deposited by sputtering, low temperature plasma enhanced chemical vapor deposition (PECVD), or electron beam evaporation to create a low quality layer which may be more easily removed than a higher quality layer. The sacrificial release layer 106 can also be deposited to be porous so that it may be more quickly etched. However these deposition methods are not required, and other deposition methods can be used in accordance with embodiments of the invention.

Figures 1, 1D:
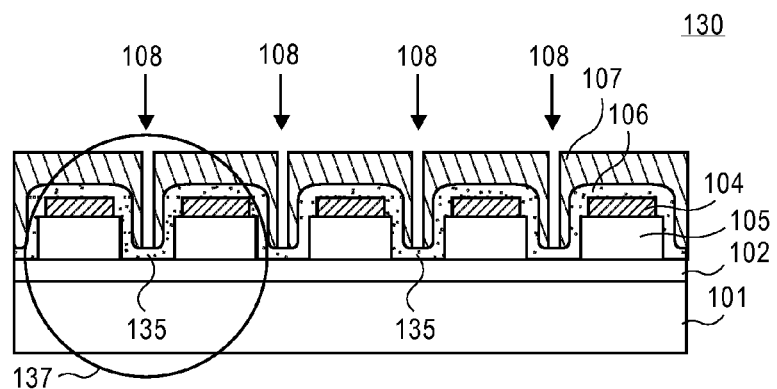
FIG. 1D-1 is a cross-sectional side view similar to FIG. 1C after a mask layer is deposited over the sacrificial release layer according to one embodiment of the invention
Figures 1, 1D, 2:
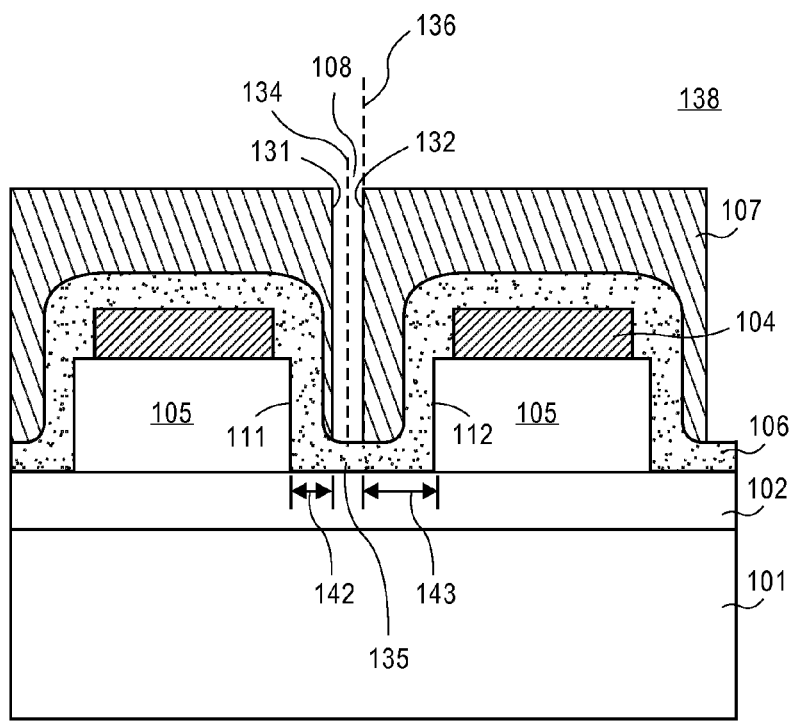

FIG. 1D-1 is a cross-sectional side view 130 similar to FIG. 1C after a mask layer is deposited over the sacrificial release layer according to one embodiment of the invention. A mask layer 107 (e.g. hard mask, or photoresist) is patterned and etched to form openings 108 at predetermined locations between micro devices 105 to expose portions 135 of sacrificial release layer 106. In one embodiment, the openings 108 are formed diagonally between the micro devices 105 in the array. In one embodiment, the openings 108 are formed axially between the micro devices 105 in the array. The term axially between as used herein is meant to refer to a location between micro devices having a sidewall in an axial direction (e.g. x-axis, y-axis) of the array. Patterning and etching of the mask is known to one of ordinary skill in the art of electronic device manufacturing. In one embodiment, opening 108 is closer to one micro device than to an adjacent micro device, as shown in FIG. 1D-1. FIG. 1D-2 shows an enlarged view 138 of a portion 137 of the structure depicted in FIG. 1D-1. As shown in FIG. 1D-2, a center axis 134 of opening 108 is shifted relative to a center axis 136 between the micro devices 105. A width 143 of the sacrificial release layer between the micro devices 105 underneath a portion 132 of the mask that covers a side surface 112 of the micro device is greater than a width 142 of the sacrificial release layer between the micro devices 105 underneath a portion 131 of the mask that covers side surface 111 of the micro device. As will become apparent in the following description, this allows underetching the sacrificial release layer to selectively expose a portion of side surface 111 of the micro device to provide a shear release attachment area while not exposing a portion of side surface 112 of the adjacent micro device. In one embodiment, side surfaces 111 of the micro devices are axial side surfaces of the micro devices. In one embodiment, the side surfaces 111 of the micro devices are corner or diagonal side surfaces of the micro devices.

Figure 1E:
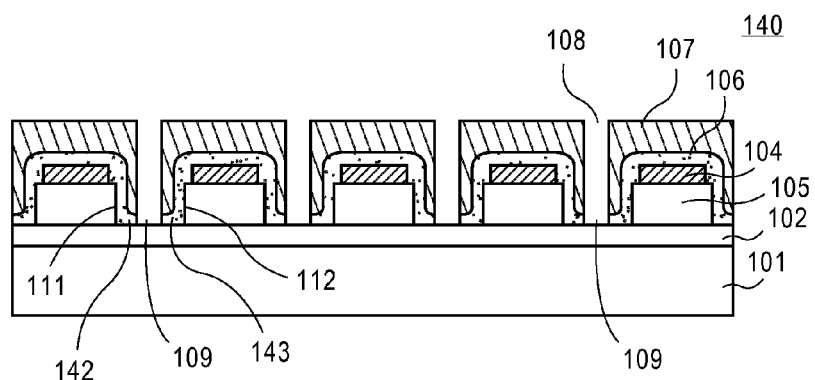
FIG. 1E is a cross-sectional side view similar to FIG. 1D-1 after portions of the sacrificial release layer between the micro devices are etched according to one embodiment of the invention.

FIG. 1E is a cross-sectional side view 140 similar to FIG. 1D-1 after portions 135 of the sacrificial release layer 106 between the micro devices 105 are removed through openings 108 in the mask 107 down to the optional cap layer 102 on the handle substrate 101 according to one embodiment of the invention. In an embodiment, the portions 135 of the sacrificial release layer at the predetermined locations between the micro devices 105 are dry etched to form openings 109 to expose optional cap layer 102 on handle substrate 101. Etching may be anisotropic. For example, dry etching techniques such as reactive ion etching (RIE), electro-cyclotron resonance (ECR), inductively coupled plasma reactive ion etching ICP-RIE, and chemically assisted ion-beam etching (CAIBE) may be used to remove the portions 135 of the sacrificial release layer between the micro devices 105 to form openings 109. For example, where the sacrificial release layer 106 is formed of silicon, etching may be a dry $SF_6$ plasma chemistry. In one embodiment, the openings 109 in the sacrificial release layer 106 are positioned off-center between micro devices 105. For example, the openings 109 may be formed off-center between axial side surfaces of the micro devices 105 to form a sidewall closer to one micro device than an adjacent micro device. This may be used to form sidewalls and shear release posts in the structure illustrated in FIG. 3B. Still referring to FIG. 1E, opening 109 is closer to side surface 111 of a micro device than to side surface 112 of an adjacent micro device. In one embodiment, the openings 109 are formed axially between (e.g. horizontally or vertically from top view) the micro devices 105 in the array, for example along a horizontal line A-A1, as shown in the top view illustration in FIG. 3A. In one embodiment, the openings 109 are formed diagonally between the micro devices 105 in the array. As shown in FIG. 1E, the widths 142, 143 of the sacrificial release layer underneath the mask are exposed through openings 109. In one embodiment, the sacrificial release layer 106 is silicon oxide layer, and the dry etching chemistries may be for example $CF_4$ or $SF_6$ plasma.

Figure 1F:
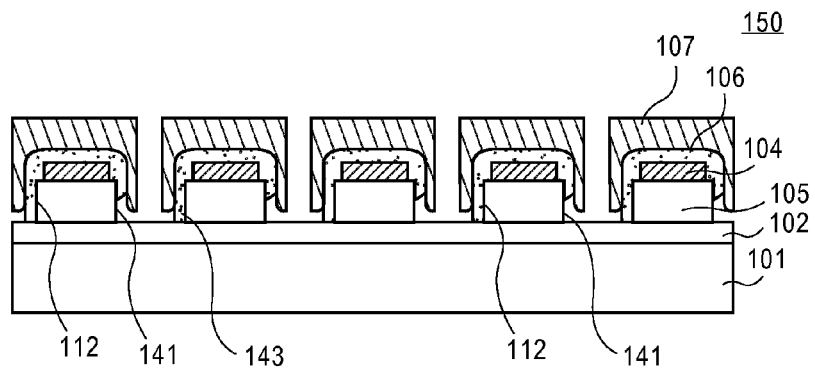
FIG. 1F is a cross-sectional side view similar to FIG. 1E after the portions of the sacrificial release layer underneath the mask are removed according to one embodiment of the invention.

FIG. 1F is a cross-sectional side view 150 similar to FIG. 1E after the widths 142 of the sacrificial release layer underneath the mask are removed according to one embodiment of the invention. The sacrificial release layer 106 is under etched through openings 109 to expose the side portions 141 of the side surfaces 111 of the micro devices 105 to provide shear release attachment areas. In the embodiment illustrated, the sacrificial release layer 106 still covers the side surfaces 112 of the micro devices 105. Because openings 109 are located off center between the micro devices 105, the widths 143 of the sacrificial layer are not completely removed, though they may be partially removed to a width equal to or slightly more than the widths 142 that were removed. In an embodiment, etching is isotropic. In this manner, anisotropic etching as illustrated in FIG. 1E, followed by isotropic etching as illustrated in FIG. 1F may allow for better etching control to expose side portions 141. In an embodiment, the sacrificial release layer 106 underneath the mask 107 is removed to expose side surface portions 141 of the micro devices 105 using an isotropic wet etch or vapor etch for a predetermined amount of time. In one embodiment, the wet etch rate of the sacrificial release layer underneath the mask is from about 100 angstroms (Å) to about 1000 Å per minute. In one embodiment, the wet etch rate of the sacrificial release layer underneath the mask is less than about 100 Å per minute. For example, a buffered oxide etch (BOE), a buffered HF (BHF), water diluted HF, or vapor HF can be used to wet etch the sacrificial release layer underneath the mask for a predetermined amount of time to expose the side surface portions 141 of the micro devices. Typically, BOE is a mixture of a buffering agent, such as ammonium fluoride ($NH_4F$), and hydrofluoric acid (HF). Where the sacrificial release layer is formed of silicon, wet etching may be performed using a potassium hydroxide (KOH) or tetramethylammonium hydroxide (TMAH) etching solution.

In one embodiment, the width 142 of the sacrificial release layer underneath the mask determines the height of the side surface portion 141 to form the attachment area for the micro device. In one embodiment, the height of the side surface portion 141 of the micro device is greater than twice of the width of the sacrificial release layer being removed therefrom. As shown in FIG. 1F, the height of the exposed side surface portion 141 of the micro device to form the attachment area is smaller than the height of the micro device. In one embodiment, the height of the side surface portion 141 of the micro device to form the attachment area is not greater than 50% of the height of the micro device. For example, the micro devices 105 can be micro LED devices having the height of about 3.5 μm, and the height of the exposed side surface portion 141 to form the attachment area of the micro device can be less than about 1.75 μm. As will become apparent in the following description, the height of exposed side surface portion 141 of the micro device will correspond to the shear release attachment area of the shear release post of the stabilization layer to be formed, with increased attachment area corresponding to increased adhesion of the micro device to the shear release post.

Figure 1G:
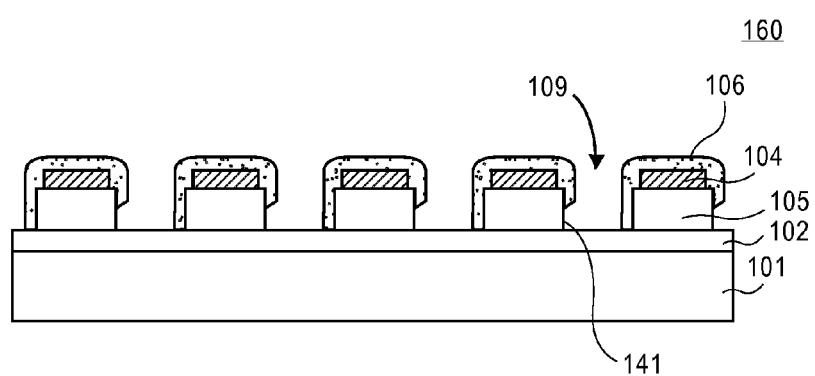
FIG. 1G is a cross-sectional side view similar to FIG. 1F after the mask is stripped off the sacrificial release layer according to one embodiment of the invention.
Figure 3A:
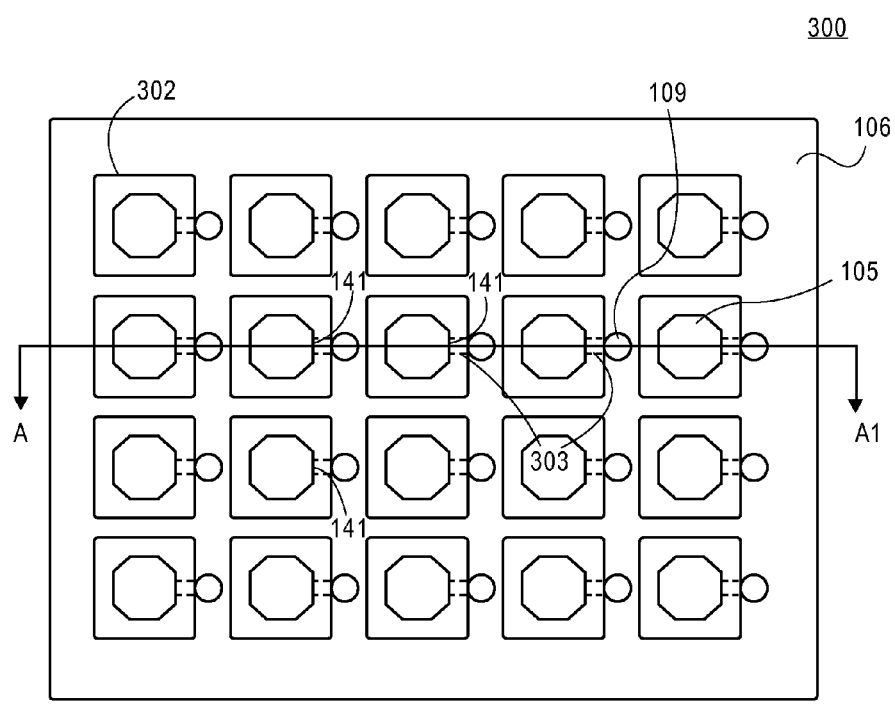
FIG. 3A is a top view of the structure having a cross-sectional portion along a line A-A1 as depicted in FIG. 1G according to one embodiment of the invention.

FIG. 1G is a cross-sectional side view 160 similar to FIG. 1F after the mask is stripped off the sacrificial release layer according to one embodiment of the invention. The mask 107 can be stripped off the sacrificial release layer 106 using one of techniques known to one of ordinary skill in the art of electronic device manufacturing. FIG. 3A is a top view 300 of the structure having a cross-sectional portion along a line A-A1 as depicted in FIG. 1G according to one embodiment of the invention. As shown in FIG. 3A, openings 109 are formed in sacrificial release layer 106 between micro devices 105. Openings 109 are located at axial side surfaces of the micro devices. Portions 302 of sacrificial release layer 106 embed micro devices 105 on substrate 101 to form staging cavities sidewalls later on in a process. As shown in FIG. 3A, portions 303 of the sacrificial release layer 106 are removed to expose side surface portions 141 of the micro devices 105 through openings 109 to provide attachment areas for stabilization layer shear release posts later on in a process. As will be described in further detail below, the attachment areas of the shear release posts are bonded with side surface portions 141 of the micro devices. It should be noted that while octagonal micro devices are shown in the Figures described herein, other shapes are possible, including rectangular, hexagonal, circular, polygonal, regular, irregular, compound, slotted, or any other shape. Furthermore, it should be noted that while micro devices with vertical side surfaces 111, 112 are described and illustrated herein, that the side surfaces 111, 112 may be inwardly or outwardly tapered. Accordingly, in the following description, references to length or height of the side surfaces 111, 112 or side surface portions 141, 241, 242 of the micro devices may refer to either vertical or tapered side surfaces.

Figure 1H:
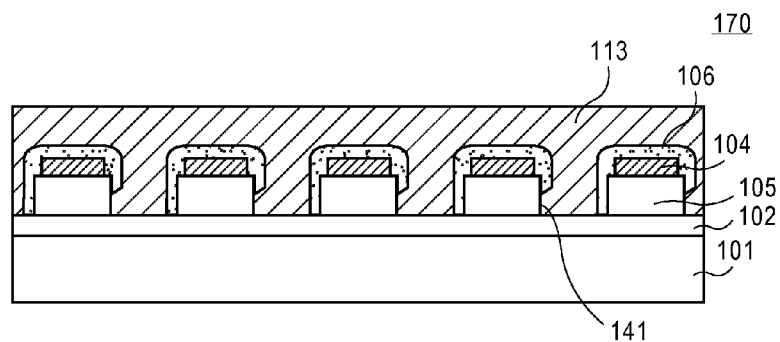
FIG. 1H is a cross-sectional side view similar to FIG. 1G after a stabilization layer is deposited over the sacrificial release layer to contact the exposed portions of the micro devices according to one embodiment of the invention.

FIG. 1H is a cross-sectional side view 170 similar to FIG. 1G after a stabilization layer 113 is formed over the sacrificial release layer 106 to contact the exposed side surface portions 141 of the micro devices 105 according to one embodiment of the invention. A stabilization layer 113 is formed over the sacrificial release layer 106 that is over the array of micro devices and laterally between the micro devices. The stabilization layer 113 fills up the openings 109 between the micro devices and laterally extends to contact the exposed side surface portions 141 of the micro devices 105. In one embodiment, stabilization layer 113 is formed of an adhesive bonding material. In one embodiment, the adhesive bonding material is a thermosetting material e.g., benzocyclobutene (BCB) or epoxy. In an embodiment, the thermosetting material may be associated with 10% or less volume shrinkage during curing, or more particularly about 6% or less volume shrinkage during curing so as to not delaminate from the sacrificial release layer 106 and the side surface portions 141 of the micro devices. In order to increase adhesion to the underlying structure the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 113 over the sacrificial release layer 106. In an embodiment, stabilization layer 113 is spin coated or spray coated over the sacrificial release layer 106, though other application techniques may be used. Following application of the stabilization layer 113, the stabilization layer can be pre-baked to remove the solvents. In an embodiment, the stabilization layer 113 is thicker than the height of openings between the array of micro devices 105. In this manner, the portions of the stabilization layer filling the openings 109 will become the staging cavity sidewalls, and the portions of the stabilization layer laterally extending to the side surface portions 141 of the micro devices will become the stabilization shear release posts.

In another embodiment, the stabilization layer 113 can be formed over the sacrificial layer 106 using a molding technique e.g., injection molding. In such an embodiment, the stabilization layer 113 may be fully cured during injection molding. The stabilization layer 113 may also be substantially thick so as to function as a carrier substrate and bonding to a carrier substrate is not required.

Figure 1I:
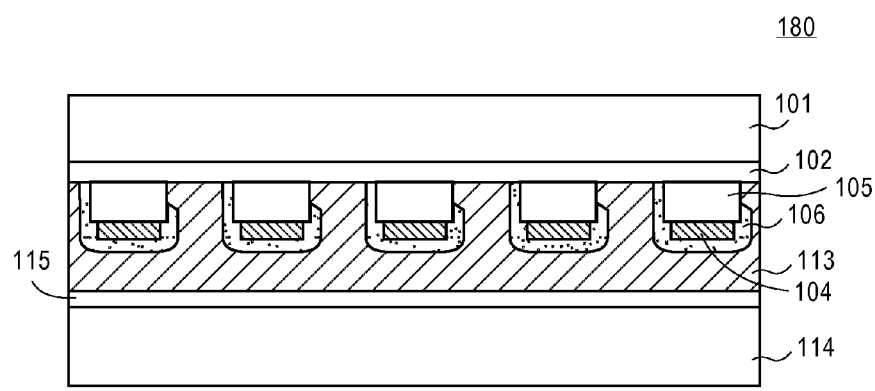
FIG. 1I is a cross-sectional side view similar to FIG. 1H after the stabilization layer is bonded to a carrier substrate according to one embodiment of the invention.

FIG. 1I is a cross-sectional side view 180 similar to FIG. 1H after the stabilization layer is bonded to a carrier substrate according to one embodiment of the invention. A carrier substrate 114 e.g., a silicon substrate, is bonded with the handle substrate 101 using the stabilization layer 113. In an embodiment, carrier substrate 114 is treated with an adhesion promoter layer 115 such as AP3000 described above. In an embodiment, bonding the stabilization layer to the carrier substrate involves curing the stabilization layer at a temperature between about 150° C. and about 300° C. In an embodiment, bonding the stabilization layer to the carrier substrate involves applying pressure to at least one of the carrier substrate and the handle substrate. Where stabilization layer 113 is formed of BCB, curing temperatures should not exceed approximately 350° C., which represents the temperature at which BCB begins to degrade. Depending upon the particular material selected, the stabilization layer may be thermally cured, or cured with application of UV energy. In one embodiment, achieving a 100% full cure of the stabilization layer is not required. In one embodiment, the stabilization layer 113 is cured to a sufficient curing percentage (e.g. 70% or greater for BCB) at which point the stabilization layer 150 will no longer reflow. Partially cured (e.g. 70% or greater) BCB stabilization layer can possess sufficient adhesion strengths with the carrier substrate 114, sacrificial release layer 106 and micro devices 105, in accordance with some embodiments of the invention.

In an embodiment, the stabilization layer 113 is formed from a spin-on electrical insulator material. In such an embodiment, planarization and bonding can be accomplished in the same operation without requiring additional processing such as grinding or polishing. However, grinding or polishing may still be performed.

Figure 1J:
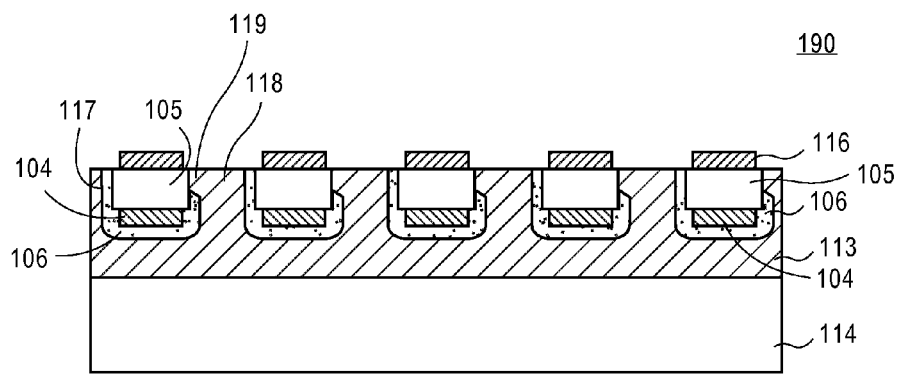
FIG. 1J is a cross-sectional side view similar to FIG. 1I after the cap layer and handle substrate are removed according to one embodiment of the invention.

FIG. 1J is a cross-sectional side view 190 similar to FIG. 1I after the cap layer and handle substrate are removed according to one embodiment of the invention. This can be accomplished using a variety of techniques depending upon the materials selection, including laser lift off (LLO), etching, or a combination of grinding and etching. For example, the handle wafer 101 can be thinned down by grinding, and then etched. Where optional cap layer 102 is an etch stop layer, etching may stop on the etch stop layer. In an embodiment the array of micro devices 105 are red-emitting LED devices, and optional cap layer 102 is an etch stop layer, e.g., InGaP layer. In an embodiment, the array of micro devices 105 are micro chips, and the optional cap layer 102 is a buried oxide layer. In an embodiment, the array of micro devices 105 are blue-emitting or green-emitting LED devices, and the optional cap layer 102 is a GaN buffer layer. In an embodiment where optional cap layer 102 is a buffer layer, etching is stopped using a timed etch. The optional cap layer 102, if present, is then removed exposing the sacrificial release layer 106 and array of micro devices 105, as shown in FIG. 1J. Optional cap layer 102 can be removed by etching after removing the handle substrate 101. For example, where optional cap layer 102 is an etch stop layer, the optional cap layer 102 may be formed from a different material than the underlying structures. For example, optional cap layer 102 of an InGaP etch stop may be removed by an HCl+$H_3PO_4$ wet etching solution. Where optional cap layer 102 is a buffer layer, the optional cap layer 102 may be removed using the same etching chemistry used to pattern the device layer 103.

An array of top conductive contacts 116 may optionally be formed over the array of micro devices 105. Conductive contacts 116 may be formed using any suitable technique known to one of ordinary skill in the art of electronic device manufacturing, e.g., electron beam physical deposition. Depending on the materials of the array of micro devices, conductive contacts 116 can include a metal, a metal alloy, or a stack of conductive layers. Conductive contacts 116 may also include a conductive oxide such as indium-tin-oxide (ITO), or a combination of one or more metal layers and a conductive oxide. In an embodiment, the conductive contacts 116 are annealed to generate an ohmic contact with the array of micro LED devices 105. In an embodiment, the stabilization layer 113 is formed of BCB, and the annealing temperature is below 350° C. In an embodiment, annealing is performed between 200° C. and 350° C., or more particularly at approximately 320° C. for approximately 10 minutes. In an embodiment, conductive contacts 116 have a thickness of about 50 angstroms. Where conductive contacts are metal, the thickness may be thin for transparency reasons. In an embodiment where conductive contacts are formed of a transparent material such as ITO, the conductive contacts may be thicker, for example, from about 1,000 Å to about 2,000 Å.

As shown in FIG. 1J, array of micro devices 105 having contacts 104 thereon are embedded in the sacrificial release layer 106 within an array of staging cavities 117. The side surface portions 141 of the micro devices 105 are laterally attached (e.g. bonded) to the shear release posts 119 of the staging cavity sidewalls 118. As shown in FIG. 1J, each shear release post 119 laterally extends between a staging cavity sidewall 118 to a micro device 105. In accordance with embodiments of the invention, the structure illustrated in FIG. 1J may be durable for handling and cleaning operations to prepare the structure for subsequent sacrificial release layer removal and electrostatic pick up.

Figure 1K:
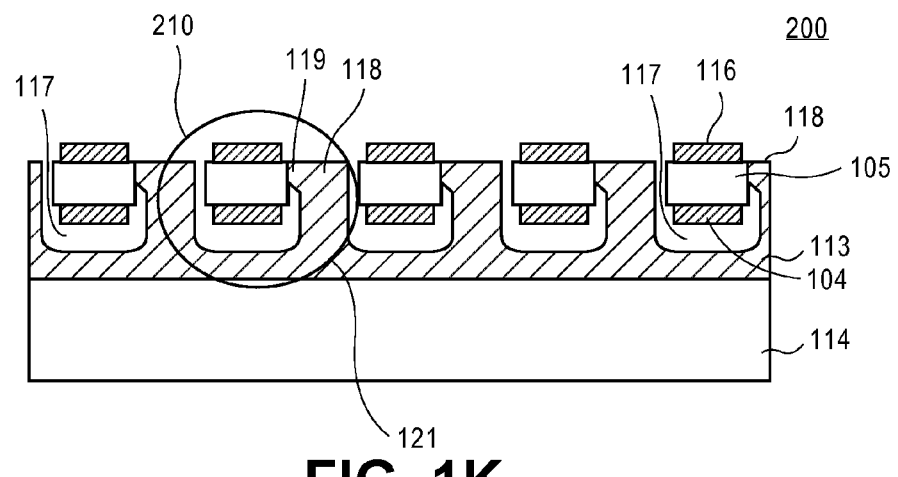
FIG. 1K is a view similar to FIG. 1J after the sacrificial release layer is removed according to one embodiment of the invention.

FIG. 1K is a cross-sectional side view 200 similar to FIG. 1J after the sacrificial release layer 106 is removed according to one embodiment of the invention. In an embodiment, sacrificial release layer 106 is removed with isotropic etching. In an embodiment, isotropic HF vapor is used to remove the sacrificial release layer 106. In another embodiment, other isotropic etching techniques may used such as wet etching or isotropic $SF_6$ plasma. Where the sacrificial release layer 106 is formed of silicon, isotropic etching may be performed with a dry $XeF_2$ vapor etching chemistry.

Figure 3B:
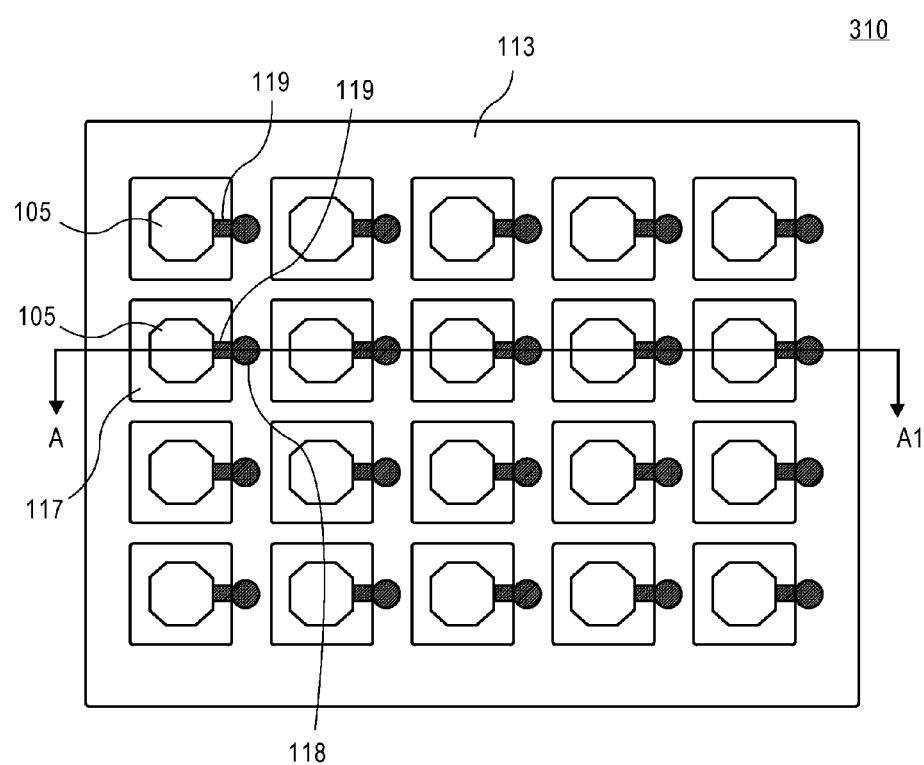
FIG. 3B is a top view of the structure having a cross-sectional portion along a line A-A1, as depicted in FIG. 1K according to one embodiment of the invention.

FIG. 3B is a top view illustration of the structure having a cross-sectional portion along a line A-A1, as depicted in FIG. 1K according to one embodiment of the invention. As shown in FIGS. 1K and 3B, an array of staging cavities 117 are formed in stabilization layer 113. An array of micro devices 105 are within the array of staging cavities 117. Each micro device 105 is laterally attached to a shear release post 119 laterally extending from a staging cavity sidewall 118. As shown in FIG. 1K, the micro devices 105 attached to shear release posts 119 hang over and are secured above a bottom surface of the corresponding staging cavities 117 formed of the stabilization layer 113.

Figure 1L:
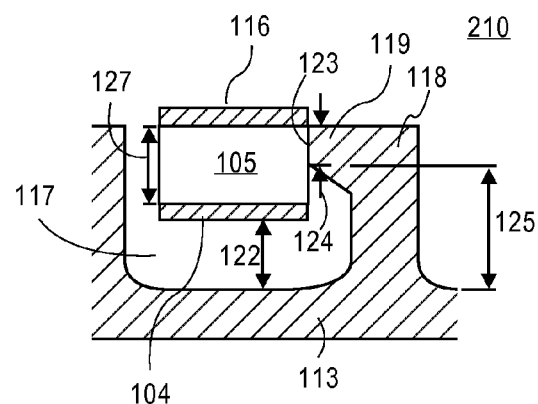
FIG. 1L shows an enlarged view of a portion of the stabilization structure depicted in FIG. 1K.

FIG. 1L shows an enlarged view 210 of a portion 121 of the stabilization structure depicted in FIG. 1K. As shown in FIG. 1L, the length of the side surface portion 141 corresponding to the attachment area of the micro device 105 is determined by a thickness 124 of a shear release attachment area 123 of the shear release post 119. In one embodiment, the height 124 of the attachment area 123 of the micro device is less than a height 127 of the micro device 105. In one embodiment, the height of the attachment area 123 of the micro device is not greater than 50% of the height of the micro device. In one embodiment, the height 124 of the attachment area 123 is greater than the height 122 separating the bottom contact 104 from the stabilization layer 113 at a bottom surface of the staging cavity 117, which is determined by the thickness of the sacrificial release layer that has been removed. Such a configuration may be accomplished, for example, by allowing the isotropic etching to continue until the desired height 124 is achieved. In one embodiment, the thickness of the micro device 105 in combination with the bottom contact 104 and top contact 116 is greater than a distance 125 from the bottom of the staging cavity 117 to the bottom surface of the of the attachment area 123 of the shear release post 119. Such a configuration may prevent a micro device that is sheared into the cavity from moving under the shear release post 119, which could potentially complicate a picking up process. In one embodiment, the distance 125 from the bottom of the staging cavity 117 to the bottom surface of the attachment area 123 of the shear release post 119 is from about 3.5 µm to about 6 µm. In one embodiment, the height 124 of the attachment area 123 of the shear release post 119 is from about 0.1 µm to about 1.7 µm. Following removal of the sacrificial release layer 106, the array of micro devices 105 attached to the array of shear release posts over the corresponding staging cavities is poised for pick up and transfer to a receiving substrate using an array of transfer heads, such as electrostatic transfer heads or transfer heads operating in accordance with other principles, such as elastomeric stamps, vacuum, magnetic, etc.

Referring now to FIGS. 2A-2H a method of fabricating an array of micro devices within an array of staging cavities is illustrated similarly as FIGS. 1A-1L, with one difference being a plurality of shear release posts laterally extend from a sidewall shared by adjacent staging cavities. In interests of clarity similar features share similar notations as described with regard to FIGS. 1A-1L.

Figure 2A:
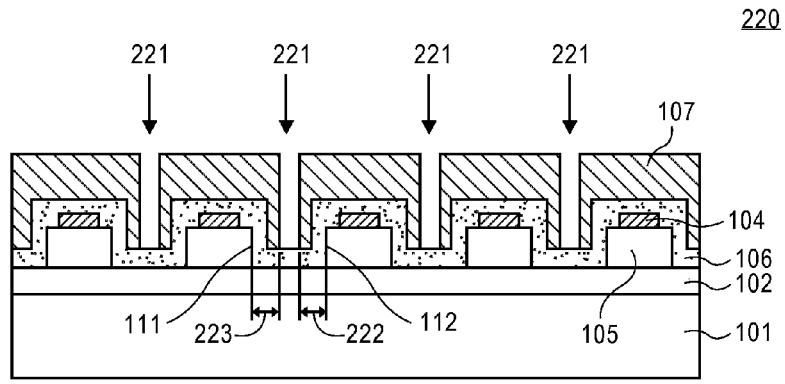
FIG. 2A is a cross-sectional side view similar to FIG. 1C after a mask layer is deposited over the sacrificial release layer according to one embodiment of the invention.

FIG. 2A is a cross-sectional view 220 similar to FIG. 1C after a mask layer is deposited over the sacrificial release layer according to one embodiment of the invention. A mask layer 107 (e.g. hard mask or photoresist) is patterned and etched to form openings 221 between micro devices 105 to expose portions of sacrificial release layer 106 between adjacent micro devices 105. Patterning and etching of the mask is known to one of ordinary skill in the art of electronic device manufacturing. As shown in FIG. 2A, openings 221 are centered between side surfaces 111, 112 of the adjacent micro devices 105. A width 223 of the sacrificial release layer underneath the mask 107 that covers side surface 111 of the micro device is about the same as a width 222 of the sacrificial release layer 106 underneath the mask 107 that covers side surface 112 of the micro device. As will become apparent in the following description, this allows underetching the sacrificial release layer to expose portions of both side surfaces 111 and 112 of the micro devices to provide shear release attachment areas. In one embodiment, openings 221 are located axially between the micro devices 105. In one embodiment, the openings 221 are formed diagonally between the micro devices 105 in the array.

Figure 2B:
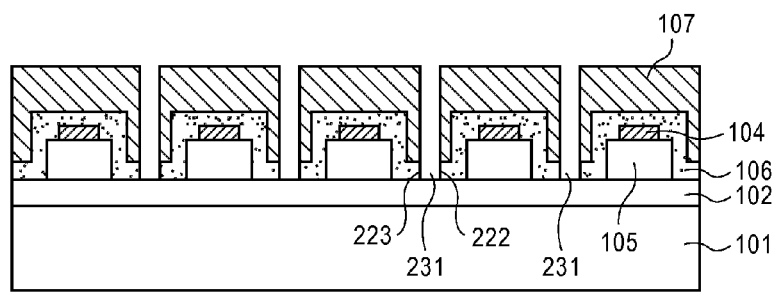
FIG. 2B is a cross-sectional side view similar to FIG. 2A after the portions of the sacrificial release layer between the micro devices are etched according to one embodiment of the invention.

FIG. 2B is a cross-sectional side view 230 similar to FIG. 2A after the portions of the sacrificial release layer 106 between the micro devices 105 are removed through openings 221 in the mask 107 down to the optional cap layer 102 on the handle substrate 101 according to one embodiment of the invention. In an embodiment, the portions of the sacrificial release layer on the optional cap layer 102 between the micro devices 105 are anisotropically etched to form openings 231 to expose optional cap layer 102 on handle substrate 101, as described above. As shown in FIG. 2B, widths 223 and 222 of the sacrificial release layer adjacent to the side surfaces 111 and 112, respectively, of the micro devices 105 underneath the mask 107 are exposed through openings 221. In one embodiment, openings 231 are located axially between the micro devices 105. In one embodiment, the openings 231 are formed diagonally between the micro devices 105.

Figure 2C:
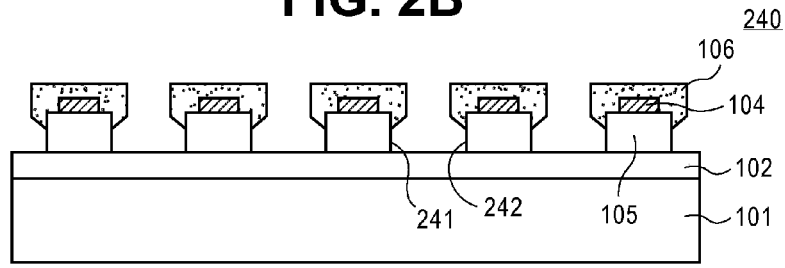
FIG. 2C is a cross-sectional side view similar to FIG. 2B after the exposed portions of the sacrificial release layer underneath the mask are removed and the mask is stripped off the sacrificial release layer according to one embodiment of the invention.

FIG. 2C is a cross-sectional view 240 similar to FIG. 2B after the widths 223, 222 of the sacrificial release layer are removed and the mask is stripped off the sacrificial release layer according to one embodiment of the invention. As illustrated, the sacrificial release layer 106 is under etched through openings 231 to expose the side portions 241 and 242 of the side surfaces 111 and 112, respectively, of adjacent micro devices 105 to create openings for the formation of shear release attachment areas. In an embodiment, an isotropic etch is performed for a predetermined amount of time to remove widths 223, 222 of the sacrificial release layer 106, as previously described above. Because openings 231 are centered between the adjacent micro devices 105 and the widths 223 and 222 are about the same, the isotropic etch exposes both side portions 241 and 242 of the micro devices 105. In one embodiment, the etch rate of the sacrificial release layer underneath the mask is from about 100 angstroms (Å) to about 1000 Å per minute. In one embodiment, the etch rate of the sacrificial release layer underneath the mask is less than about 100 Å per minute, as described above.

As previously described with regard to side surface portions 141, the size (e.g. height, width) of each of the exposed side surface portions 241 and 242 of the micro devices determines the size of the shear release post attachment areas with the micro devices. In an embodiment, the height of side surface portions 241 and 242 is not greater than twice of the thickness of the sacrificial release layer. As shown in FIG. 2C, the height of each of the side surface portions 241 and 242 of the micro devices exposed by removal of the widths 223 and 222 of the sacrificial release layer is smaller than the height of the micro devices 105. In one embodiment, the height of each of the side surface portions 241 and 242 of the micro devices exposed by removal of the widths 223 and 222 of the sacrificial release layer is not greater than 50% of the height of the micro devices 105, as described above.

Figure 4A:
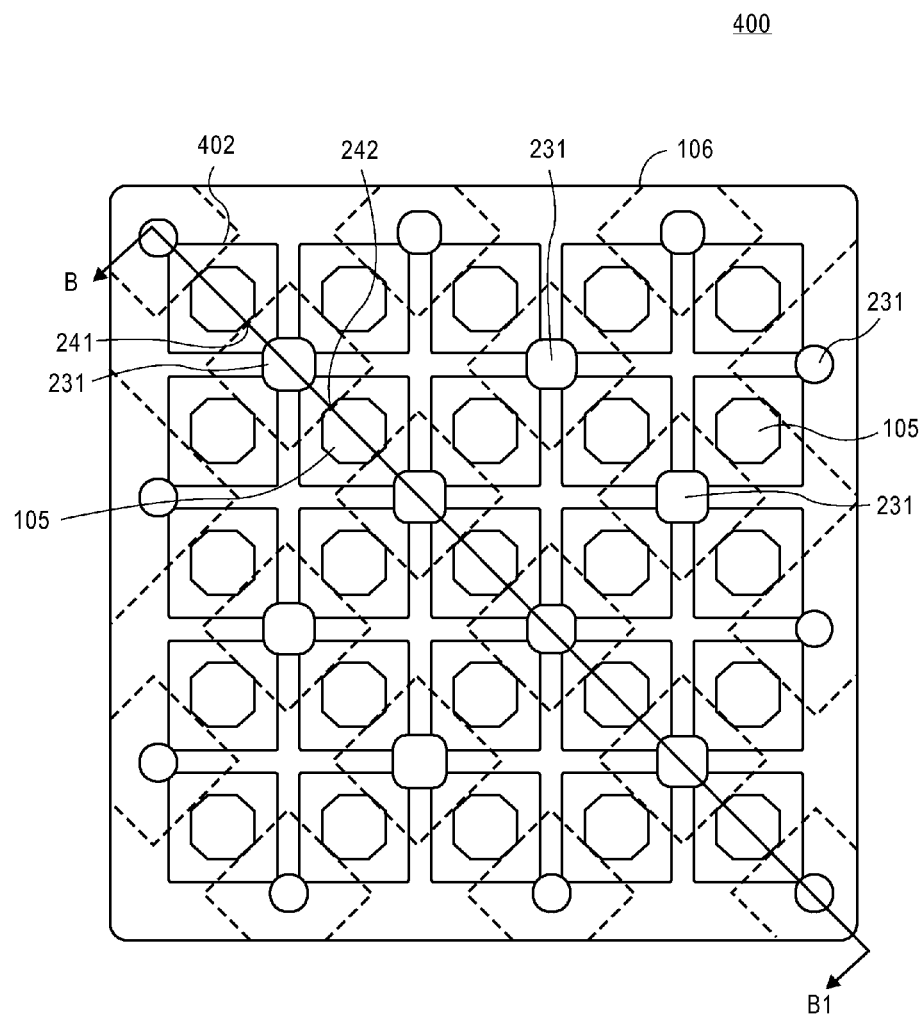
FIG. 4A is a top view of the structure having a cross-sectional portion along a line B-B1 as depicted in FIG. 2C according to one embodiment of the invention.

The mask 107 can be stripped off the sacrificial release layer 106 using one of techniques known to one of ordinary skill in the art of electronic device manufacturing. FIG. 4A is a top view 400 of the structure that has a cross-sectional portion along a line B-B1 as depicted in FIG. 2C according to one embodiment of the invention. As shown in FIG. 4A, openings 231 are formed in sacrificial release layer 106 down to optional cap layer 102 diagonally between the micro devices 105 in the array. Portions 402 of sacrificial release layer 106 embed micro devices 105 on substrate 101 and also partly define the staging cavities sidewalls later on in a process. As shown in FIG. 4A, the sacrificial release layer 106 is removed from the side surface portions 241 and 242 of the micro devices 105 through openings 231 to form attachment areas for the shear release posts later on in a process.

Figure 2D:
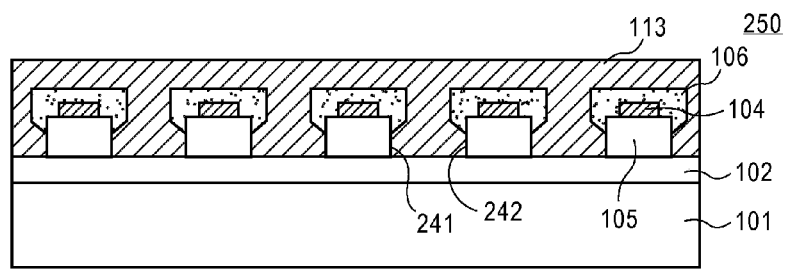
FIG. 2D is a cross-sectional side view similar to FIG. 2C after a stabilization layer is deposited over the sacrificial release layer to contact the exposed portions of the micro devices according to one embodiment of the invention.

FIG. 2D is a cross-sectional view 250 similar to FIG. 2C after a stabilization layer 113 is formed over the sacrificial release layer 106 to contact the exposed side surface portions 241 and 242 of the micro devices 105 according to one embodiment of the invention. A stabilization layer 113 is formed over the sacrificial release layer 106 that is over the array of micro devices, and laterally between the micro devices. The stabilization layer 113 fills up the openings 231 between the micro devices and laterally extends to contact the exposed side surface portions 241 and 242 of the micro devices 105. In one embodiment, stabilization layer 113 is formed of an adhesive bonding material. In one embodiment, the adhesive bonding material is a thermosetting material e.g., benzocyclobutene (BCB) or epoxy, as described above. In an embodiment, stabilization layer 113 is spin coated or spray coated over the sacrificial release layer 106, or other application techniques may be used, as described above. In an embodiment, the stabilization layer 113 is thicker than the height of openings between the array of micro devices 105. In this manner, portions of the stabilization layer surrounding the micro devices 105 will become staging cavities, and portions of the stabilization layer laterally extending to side surfaces portions 241 and 242 will become the shear release posts. The stabilization layer 113 over the sacrificial release layer 106 can function to adhesively bond the handle substrate 101 a carrier substrate. The stabilization layer 113 may also be substantially thick so as to function as a carrier substrate and bonding to a carrier substrate is not required.

Figure 2E:
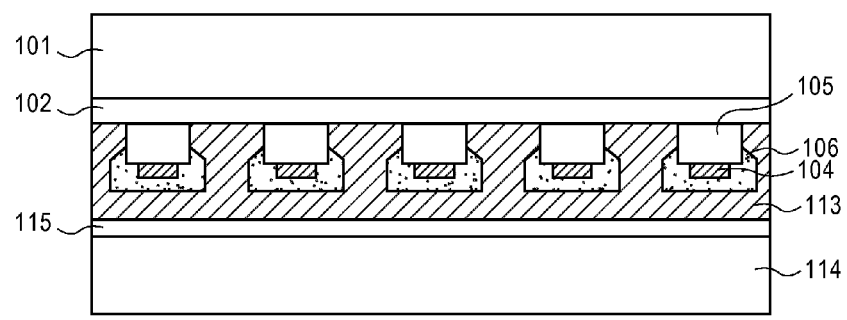
FIG. 2E is a cross-sectional side view similar to FIG. 2D after the stabilization layer is attached to a carrier substrate according to one embodiment of the invention.

FIG. 2E is a cross-sectional side view 260 similar to FIG. 2D after the stabilization layer is bonded to a carrier substrate according to one embodiment of the invention. A carrier substrate 114 e.g., a silicon substrate, is bonded with the handle substrate 101 using the stabilization layer 113, as described above. In an embodiment, carrier substrate 114 is treated with an adhesion promoter layer 115 such as AP3000 described above.

Figure 2F:
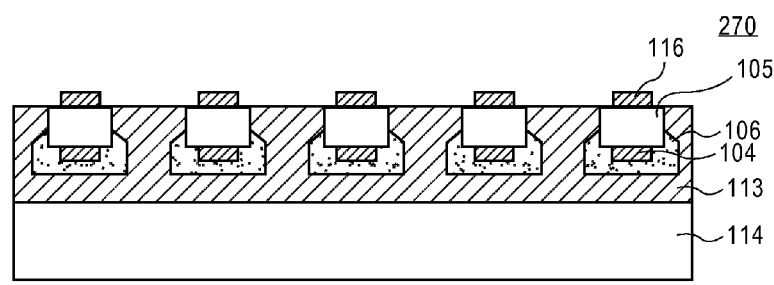
FIG. 2F is a cross-sectional side view similar to FIG. 2E after the cap layer and handle substrate are removed according to one embodiment of the invention.

FIG. 2F is a cross-sectional side view 270 similar to FIG. 2E after the optional cap layer and handle substrate are removed according to one embodiment of the invention, as described above. An array of top conductive contacts 116 may optionally be formed over the array of micro devices 105, as described above.

As shown in FIG. 2F, array of micro devices 105 having contacts 104 thereon are embedded in the sacrificial release layer 106 within an array of staging cavities 281 of the stabilization layer 113. The portions of the micro devices 105 are attached (e.g. bonded) to shear release posts 282 extending laterally from the staging cavity sidewalls 285. In an embodiment, the structure is durable for handling and cleaning operations to prepare the structure for subsequent sacrificial release layer removal and transfer of the micro devices.

Figure 2G:
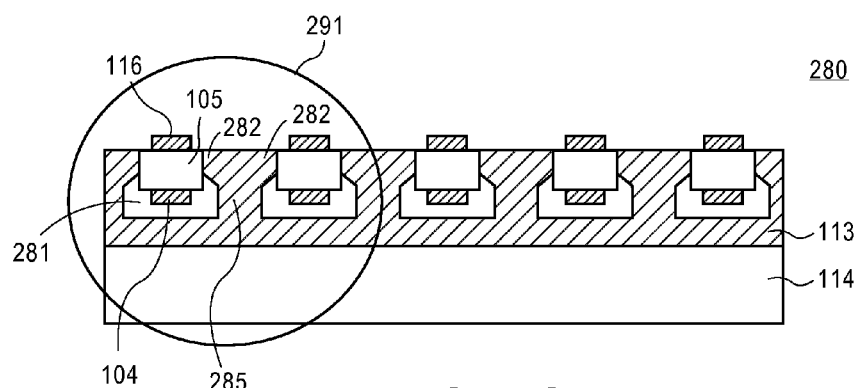
FIG. 2G is a cross-sectional side view similar to FIG. 2F after the sacrificial release layer is removed according to one embodiment of the invention.
Figure 2H:
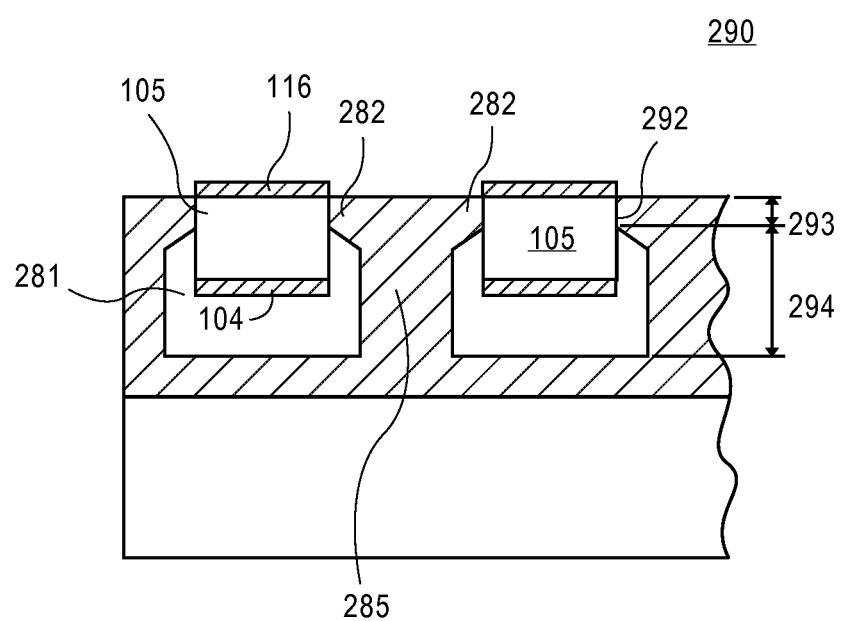
FIG. 2H shows an enlarged view of a portion of the stabilization structure depicted in FIG. 2G.

FIG. 2G is a cross-sectional side view 280 similar to FIG. 2F after the sacrificial release layer 106 is removed resulting in the array of micro devices 105 bonded to the shear release posts 282 and suspended within open staging cavities 281 according to one embodiment of the invention. In an embodiment, an isotropic etching chemistry such as HF vapor is used to remove the sacrificial release layer 106. In another embodiment, other isotropic etching techniques may used such as wet etching or isotropic $SF_6$ plasma. Where the sacrificial release layer 106 is formed of silicon, isotropic etching may be performed with a dry $XeF_2$ vapor etching chemistry FIG. 2H shows an enlarged view 290 of a portion 291 of the stabilization structure depicted in FIG. 2G showing the height 293 of the attachment area 292 of the shear release posts 282 and the micro devices 105. In one embodiment, the height 293 of the attachment areas 292 of the micro device 105 to the shear release post 282 is less than the height of the micro device 105. In one embodiment, the height of the attachment areas of the micro device to the shear release post 282 is not greater than 50% of the height of the micro device 105. In one embodiment, a distance 294 from the bottom of the staging cavity 281 to the bottom surface of the attachment area 292 of the shear release post 282 is less than the total height of the micro device 105, bottom contact 104 and top contact 116, as described above. In one embodiment, the thickness 293 of the attachment area 292 is greater than a distance from the bottom of bottom contact 104 to the bottom of the staging cavity 281, as described above. Following removal of the sacrificial release layer 106, the array of micro devices 105 attached to the array of shear release posts 282 over the corresponding staging cavities is poised for pick up and transfer to a receiving substrate.

Figure 4B:
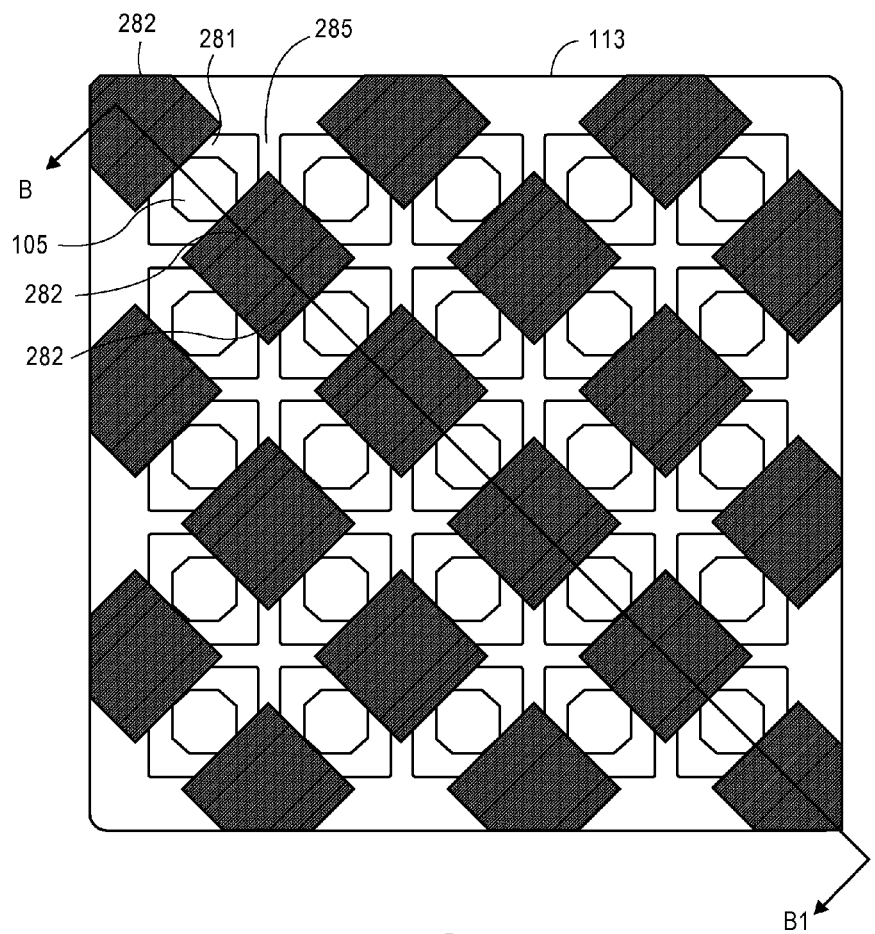
FIG. 4B is a top view of the structure having a cross-sectional portion along a line B-B1 as depicted in FIG. 2G according to one embodiment of the invention.

FIG. 4B is a top view 410 of the structure having a cross-sectional portion along a line B-B1 as depicted in FIG. 2G according to one embodiment of the invention. As shown in FIGS. 2G and 4B an array of staging cavities 281 are formed in stabilization layer 113. The shear release posts 282 are formed diagonally between micro devices 105 in the array and laterally extend from a staging cavity sidewall 285 diagonally between micro devices 105. In an embodiment, each micro device is connected to at least one shear release post 282. In one embodiment, four shear release posts 282 laterally extend from a staging cavity sidewall 285 diagonally between four micro devices 285. In an embodiment, each micro device 105 is connected to two shear release posts 282 at two opposite corners of the micro device. As shown in FIG. 2G, the micro devices 105 hang over and are secured above a bottom surface of the staging cavities 281 formed of the stabilization layer 113, and each micro device 105 is laterally surrounded by sidewalls of a corresponding staging cavity 281.

Figure 5:
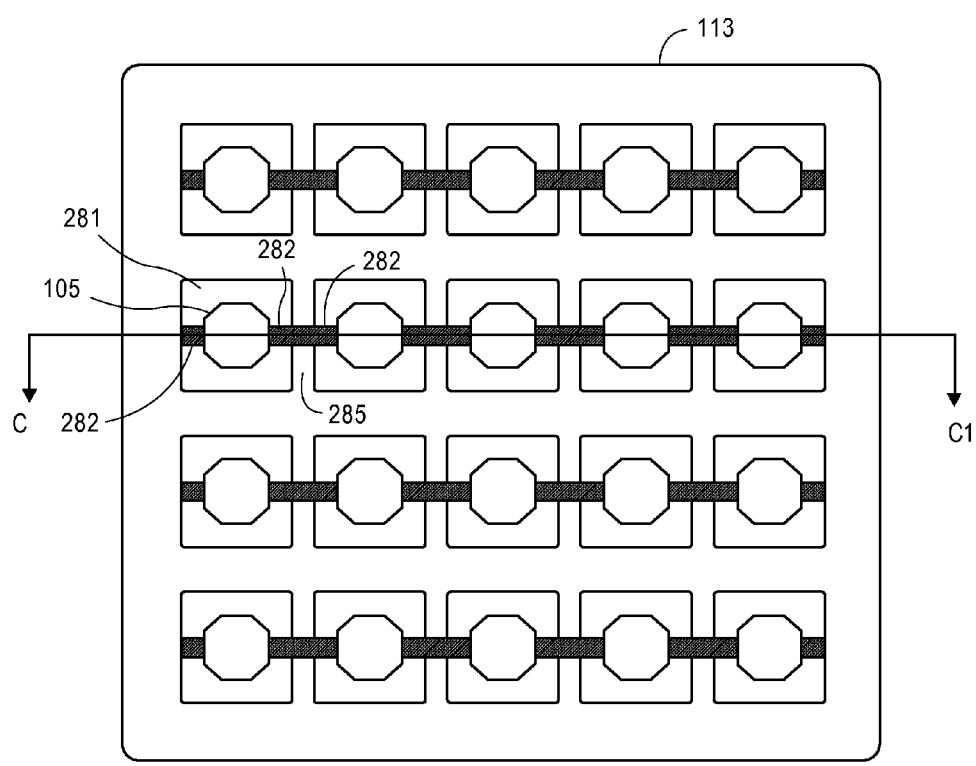
FIG. 5 is a top view of the structure having a cross-sectional portion along a line C-C1 as depicted in FIG. 2G according to one embodiment of the invention.

FIG. 5 is a top view of the structure having a cross-sectional portion along a line C-C1 as depicted in FIG. 2G according to one embodiment of the invention. As shown in FIG. 5, an array of staging cavities 281 are formed in stabilization layer 113. The shear release posts 282 are formed at axial side surface portions of micro devices 105 and extend laterally between the micro devices 105 and the staging cavity sidewalls 285. In the embodiment illustrated, each micro device is connected to two shear release posts 282. As shown in FIG. 2G, the micro devices 105 hang over and are secured above a bottom surface of the staging cavities 281 formed of the stabilization layer 113 and each micro device 105 is kept in place by being connected via opposing shear release posts 282 while being laterally surrounded by sidewalls 285 of a corresponding staging cavity 281. In an embodiment, shear release posts 282 laterally extend from opposite sides of a staging cavity sidewall 285 and connect (e.g. bond) with axial sidewalls of adjacent micro devices.

Figure 6A:
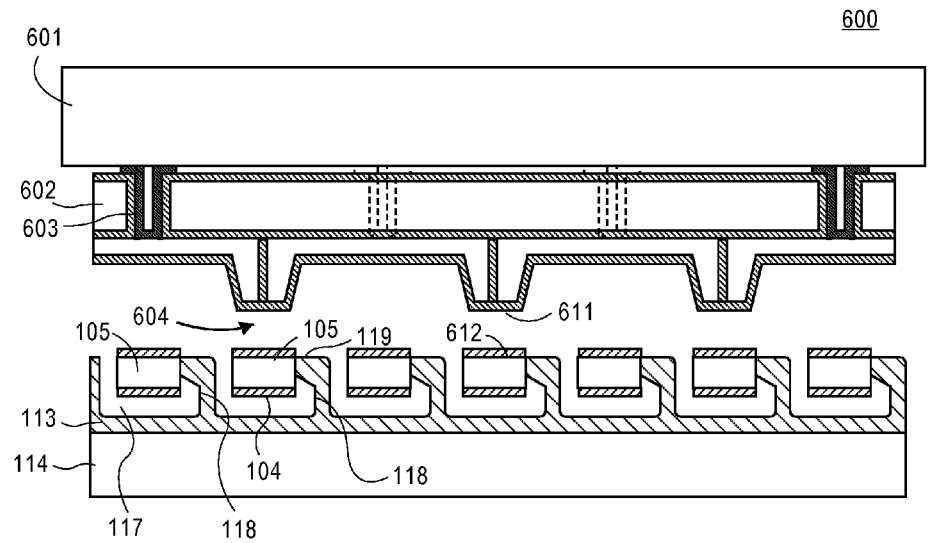
FIGS. 6A-6G are cross-sectional side view illustrations for a method of transferring an array of micro devices from a carrier substrate to a receiving substrate according to one embodiment of the invention.

FIGS. 6A-6G are cross-sectional side view illustrations for a method of transferring an array of micro devices from a carrier substrate to a receiving substrate according to one embodiment of the invention. FIG. 6A is a cross-sectional side view 600 illustrating an array of micro device transfer heads 604 supported by a substrate 602 and aligned over an array of micro devices 105 according to one embodiment of the invention. Array of micro devices 105 are laterally attached to shear release posts 119 over a corresponding array of staging cavities 117 of stabilization layer 113 on a carrier substrate 114. By way of example, the transfer head assembly 601 may comprise a working circuitry that is electrically connected to substrate 602, for example, through a plurality of vias 603. In the embodiment illustrated, the transfer heads 604 have a contact area 611 smaller than a top surface area 612 of the micro devices 105. In accordance with embodiments of the invention, such a configuration allows the spacing (street) between the micro devices to not be limited by the size of the transfer heads. This may result in an increased number of micro devices per area unit on the carrier substrate 114.

Figure 6B:
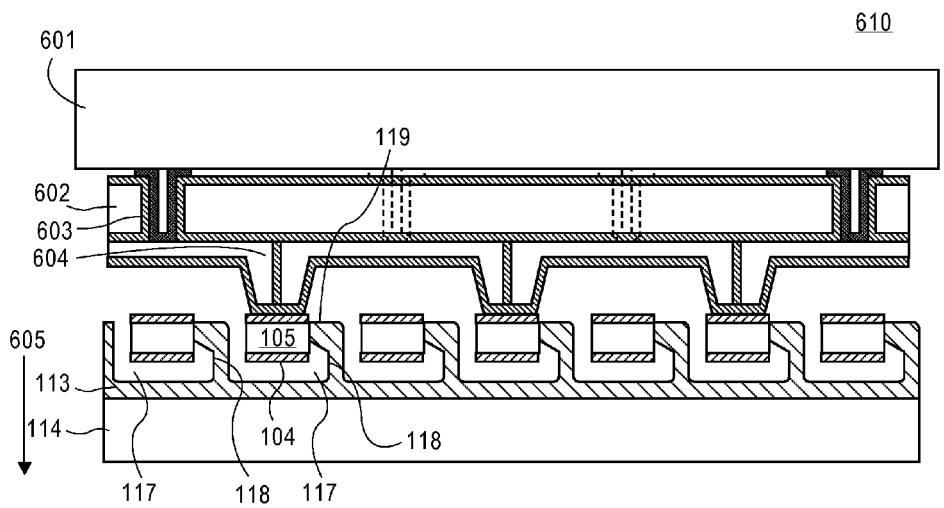
Figure 6C:
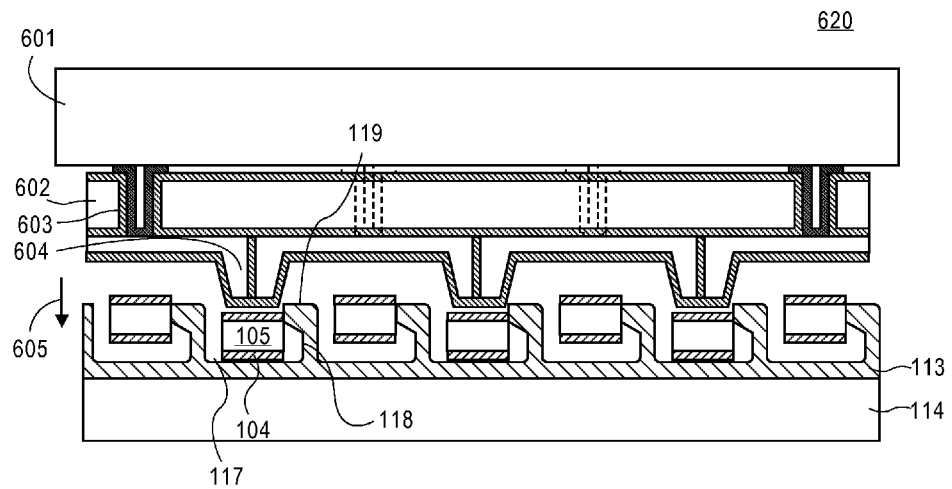
Figure 6D:
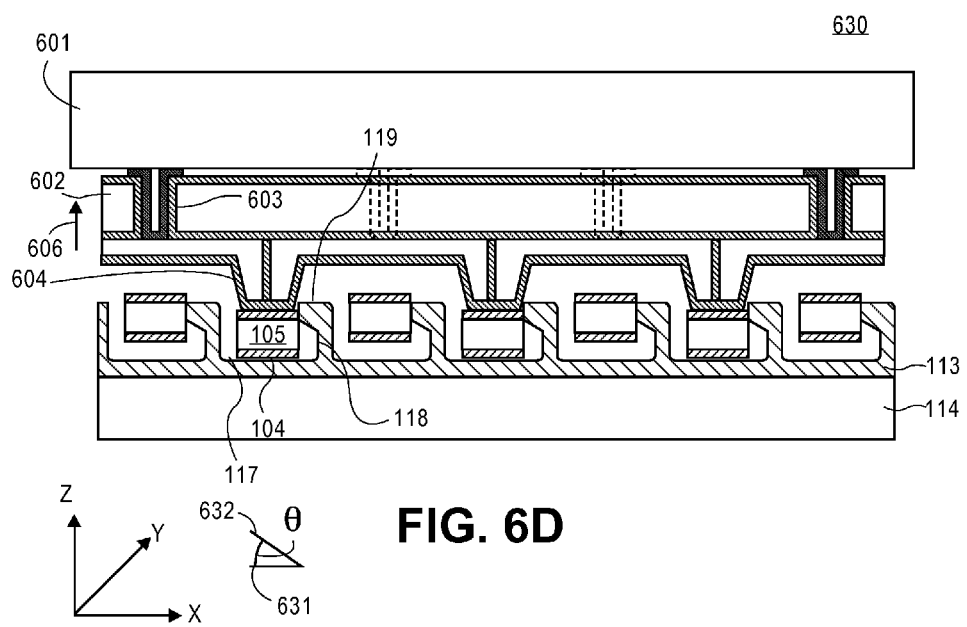
Figure 6E:
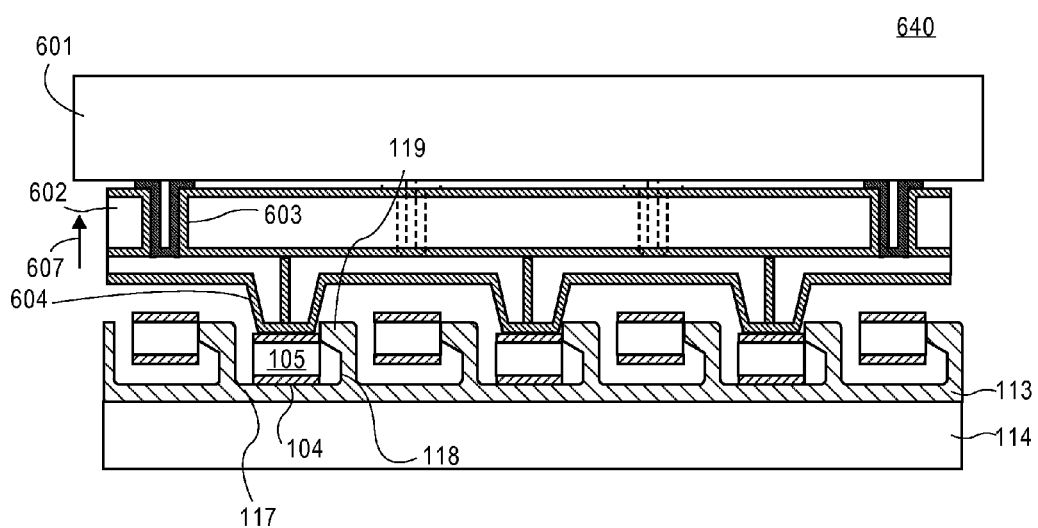

The array of micro devices 105 are then contacted with the array of transfer heads 604, as illustrated in a cross-sectional side view 610 of FIG. 6B. As illustrated, the pitch of the array of transfer heads 604 is an integer multiple of the pitch of the array of micro devices 105. A push down pressure 605 is applied to the array of micro devices 105 from the array of transfer heads 604 to shear the array of micro devices 105 off the shear release posts 119. In one embodiment, the pressure 605 from the array of transfer heads 604 provides a mechanical force to push each micro device 105 down and to break a bonding between the micro device 105 and the shear release post 119. As shown in a cross-sectional side view 620 of FIG. 6C, the array of micro devices 105 move into an array of staging cavities 117 when sheared off the shear release posts 119.

The array transfer heads then pick up the array of sheared off micro devices. As previously described, embodiments of the invention may be practiced with transfer heads operating in accordance with a variety of principles, such as electrostatic transfer heads or transfer heads operating in accordance with other principles, such as elastomeric stamps, vacuum, magnetic, etc. In an embodiment, the transfer heads operation in accordance with electrostatic principles, and a voltage is applied to the array of transfer heads 604 to provide an electrostatic force to pick up the micro devices. In an exemplary embodiment, the voltage can be applied from the working circuitry within a transfer head assembly 601 in electrical connection with the array of transfer heads through vias 603. The array of micro devices 105 sheared off the shear release posts 119 are picked up by the array of transfer heads 604. In one embodiment, the array of micro devices 105 are picked up by an electrostatic force 606. In one embodiment, the force to pick up a micro device is substantially smaller than the force to shear the micro device off the shear release post. In one embodiment, the voltage applied to the array of transfer heads 604 to pick up the micro devices that have been shared off the shear release posts is substantially smaller than the voltage that would be required to pick up the micro devices that are attached to the shear release posts 119 since it is not required to break the bonds between the micro devices and the shear release posts with the pick up pressure generated by the transfer heads. In accordance with embodiments of the invention, a reduced pick up voltage required to pick up sheared off micro devices allows for a reduced contact area of transfer heads, and consequently the contact area of the transfer heads can be smaller than the top surface area of the micro devices. Such a configuration may provide more alignment tolerance and simplify the positioning of the array of transfer heads over the array of micro devices. In one embodiment, the smaller contact area of transfer heads 604 over the micro devices 105 increases a lateral alignment tolerance along a plane including X and Y axes.

In operation, the transfer head assembly 601 and carrier substrate 114 are aligned such that the contact area 611 of the array of transfer heads 604 and the top surface 612 of the array of micro devices are parallel. However, due to the small scale of the micro devices and transfer heads, e.g. 1-100 μm, or more specifically 10 μm or 5 μm, it can be difficult to obtain absolute planarity. Accordingly, in operation an angle θ may exist between a plane 632 of the transfer heads and a plane 631 of the array of micro devices. As a result, a transfer head 604 on one side of the transfer head assembly 601 may contact a micro device 105 prior to a transfer head 604 on another side of the transfer head assembly 601 contacting a corresponding micro device. In accordance with embodiments of the invention, the combination of shear release posts 119 and staging cavities 117 provides for a built in tolerance which allows for those micro devices 105 that are first contacted with the transfer heads 604 to be sheared off from the shear release posts 119 without imparting an undue force that could further damage the micro devices or transfer heads. The sheared off micro devices may then move into the staging cavities 117 as the array of transfer heads continues to be moved toward the carrier substrate to contact all of the micro devices 105. In this manner, it may be possible to gradually make contact and shear off all micro devices while minimizing stress concentration and associated damage to the micro devices or transfer heads that first make contact.

In various embodiments, the operation of applying the voltage to pick up the array of micro devices sheared off the shear release post can be performed in various orders. For example, the voltage can be applied prior to contacting the array of micro devices with the array of transfer heads, prior to applying a push down pressure to the array of micro devices, while contacting the micro devices with the array of transfer heads, while applying a push down pressure to the array of micro devices, after contacting the micro devices with the array of transfer heads, or after applying a push down pressure to the array of micro devices.

If the voltage is applied to the transfer heads 604 while applying the push down pressure 605 this provides a grip pressure that may prevent the micro devices 105 that are sheared off the shear release posts 119 from falling onto a bottom of the corresponding staging cavities 117. Such a scenario is illustrated in the cross-sectional side view 630 of FIG. 6D.

In one embodiment, a voltage is not applied to the transfer heads 604 while applying the push down pressure to the array of micro devices, and the micro devices 105 sheared off the shear release posts 119 are allowed to fall onto a bottom of the corresponding staging cavity 117. The micro devices 105 may then be picked up by transfer heads 604 from the bottom of the corresponding staging cavities, as shown in a cross-sectional side view 640 of FIG. 6E.

Figure 6F:
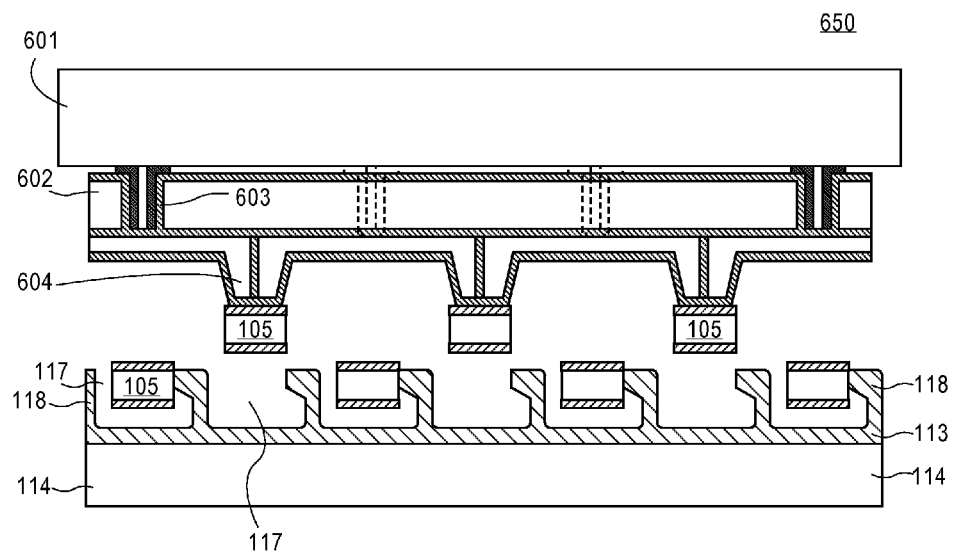
Figure 6G:
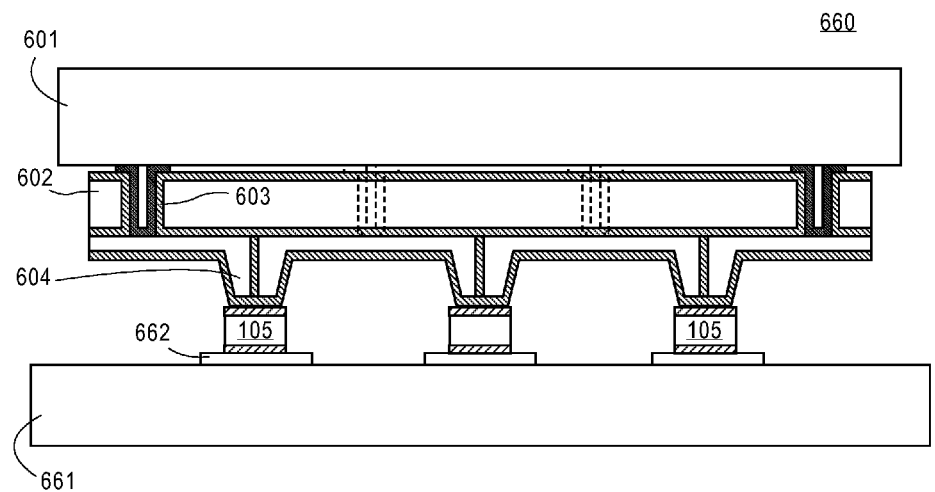

FIG. 6F is a cross-sectional side view 650 that illustrates the array of micro devices 105 being picked up by the array of transfer heads 604 according to one embodiment of the invention. The micro devices 105 not contacted by transfer heads 604 remain attached to their shear release posts on carrier substrate 114.

Following the pick up operation from the carrier substrate, the picked up micro devices can then be transferred and bonded to a receiving substrate with the transfer head assembly. The transfer heads 604 bring the array of micro devices 105 into contact with contact pads 662 (e.g. metals, transparent conductive oxides, conductive polymers) on a receiving substrate 661 as illustrated in the cross-sectional side view 660 of FIG. 6G. For example, the receiving substrate may be, but is not limited to, a display substrate, a lighting substrate, a substrate with functional devices such as transistors or ICs, or a substrate with metal redistribution lines.

In one embodiment, an operation is performed to diffuse a bonding layer connecting the array of micro devices 105 with the contact pads 662 while contacting the array of micro devices with the contact pads 662. For example, a silver, gold, indium, or tin micro device bonding layer may be diffused with a silver, gold, indium, or tin receiving substrate bonding layer on the contact pad 662, though other materials may be used. In an embodiment, sufficient diffusion to adhere the array of micro devices 105 with the array of contact pads 662 can be achieved at temperatures of less than 200° C. For example, heat can be applied from a heat source located within the transfer head assembly 601 and/or receiving substrate 661.

Where the transfer heads 604 include bipolar electrodes, an alternating voltage may be applied across a pair of electrodes in each transfer head 604 so that at a particular point in time when a negative voltage is applied to one electrode, a positive voltage is applied to the other electrode in the pair, and vice versa to create the pickup pressure. Releasing the array of micro devices from the transfer heads 604 may be further accomplished with a varied of methods including turning off the voltage sources, lower the voltage across the pair of silicon electrodes, changing a waveform of the AC voltage, and grounding the voltage sources.

Figure 7A:
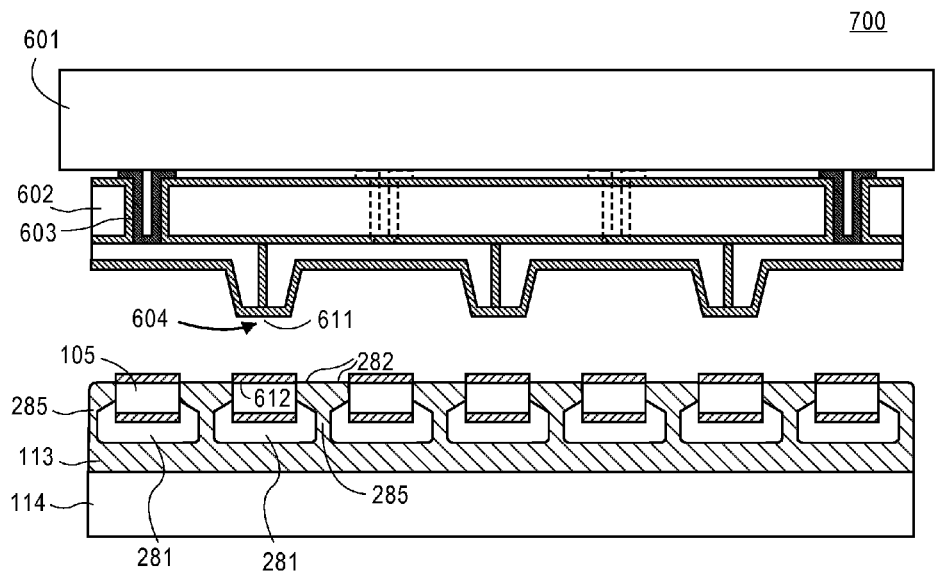
FIGS. 7A-7F are cross-sectional side view illustrations for a method of picking up an array of micro devices from a carrier substrate according to one embodiment of the invention.

FIGS. 7A-7F are cross-sectional side view illustrations for a method of picking up an array of micro devices from a carrier substrate according to one embodiment of the invention. FIG. 7A is a cross-sectional side view 700 illustrating an array of micro device transfer heads 604 positioned over an array of micro devices 105 according to one embodiment of the invention. Array of micro devices 105 are laterally attached to shear release posts 282 over a corresponding array of staging cavities 281 of stabilization layer 113 on a carrier substrate 114. As shown in FIG. 7A, each micro device 105 is laterally attached to two shear release posts 282. In the particular embodiment illustrated, the transfer heads 604 have a contact area 611 smaller than a top surface area 612 of the micro devices 105. In accordance with embodiments of the invention, such a configuration allows the spacing (street) between the micro devices to not be limited by the size of the transfer heads. This may result in an increased number of micro devices per area unit on the carrier substrate 114.

Figure 7B:
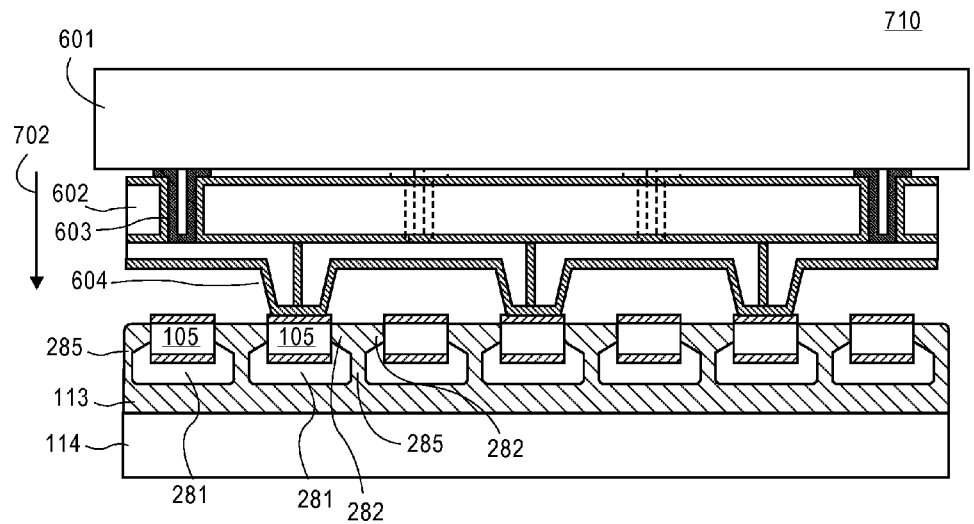
Figure 7C:
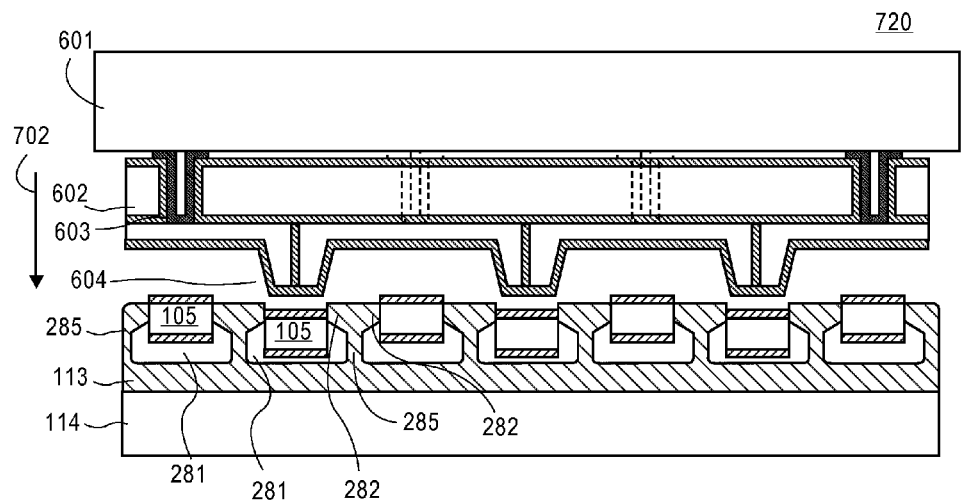
Figure 7D:
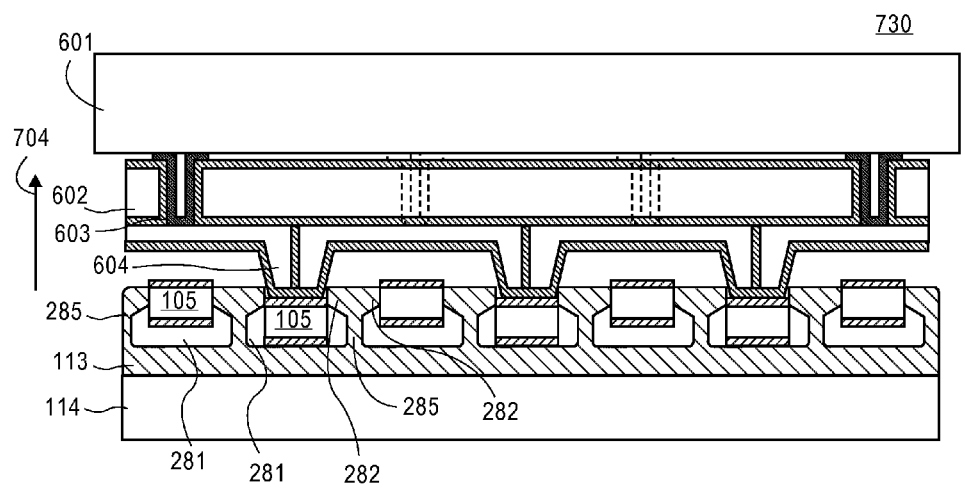

The array of micro devices 105 are then contacted with the array of transfer heads 604, as illustrated in a cross-sectional side view 710 of FIG. 7B. As illustrated, the pitch of the array of transfer heads 604 is an integer multiple of the pitch of the array of micro devices 105. A push down pressure 702 is applied to the array of micro devices 105 from the array of transfer heads 604 to shear the array of micro devices 105 off the shear release posts 282. In one embodiment, the pressure 702 from the array of transfer heads 604 provides a mechanical force to push each micro device 105 down and to break bonds between the micro device 105 and the shear release posts 282. As shown in a cross-sectional side view 720 of FIG. 7C, the array of micro devices 105 move into an array of staging cavities 281 when sheared off the shear release posts 282.

The array transfer heads then pick up the array of sheared off micro devices. As previously described embodiments of the invention may be practiced with transfer heads operating in accordance with a variety of principles, such as electrostatic transfer heads or transfer heads operating in accordance with other principles, such as elastomeric stamps, vacuum, magnetic, etc. In an embodiment, the transfer heads operation in accordance with electrostatic principles, and a voltage is applied to the array of transfer heads 604 to provide an electrostatic force, as described above. The array of micro devices 105 sheared off the shear release posts 282 are picked up by the array of transfer heads 604. In one embodiment, the array of micro devices 105 are picked up by an electrostatic force 704. In one embodiment, the force to pick up a micro device is substantially smaller than the force to shear the micro device off the shear release post. In one embodiment, the voltage applied to the array of transfer heads 604 to pick up the micro devices that have been shared off the shear release posts is substantially smaller than the voltage that would be required to pick up the micro devices that are attached to the shear release posts 282 since it is not required to break the bonds between the micro devices and the shear release posts with the pick up pressure generated by the transfer heads. In accordance with embodiments of the invention, a reduced pick up voltage required to pick up sheared off micro devices allows for a reduced contact area of transfer heads, and consequently the contact area of the transfer heads can be smaller than the top surface area of the micro devices. Such a configuration may provide more alignment tolerance (e.g., lateral alignment tolerance, angular alignment tolerance, or both) and simplify the positioning of the array of transfer heads over the array of micro devices, as described above. Furthermore, in accordance with embodiments of the invention, the combination of shear release posts 282 and staging cavities 281 provides for a built in tolerance for an alignment θ between the transfer heads and the array of micro devices, as described above. In various embodiments, the operation of applying the voltage to pick up the array of micro devices sheared off the shear release post can be performed in various orders, as described above.

If the voltage is applied to the transfer heads 604 while applying the push down pressure 702, this provides a grip pressure that may prevent the micro devices sheared off the shear release posts 282 from falling onto a bottom of the corresponding staging cavities 281. Such a scenario is illustrated in the cross-sectional side view 730 of FIG. 7D.

Figure 7E:
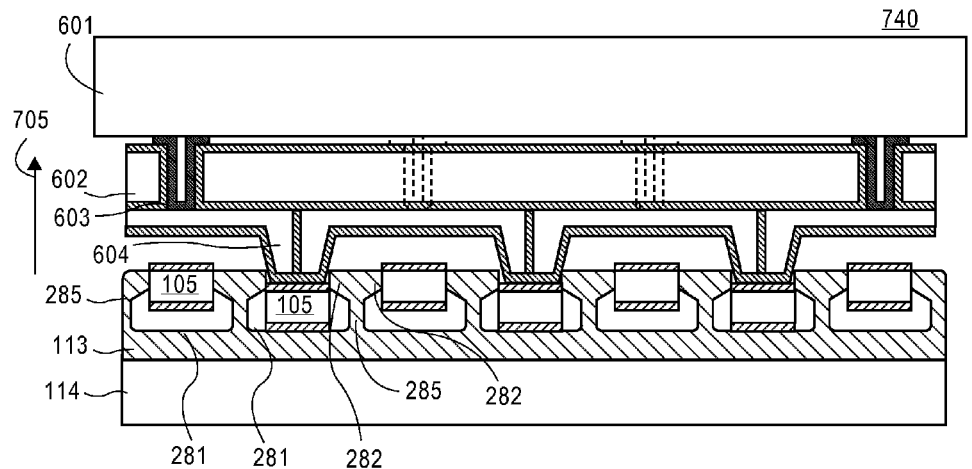

In one embodiment, a voltage is not applied to the transfer heads 604 while applying the push down pressure to the array of micro devices, and the micro devices 105 sheared off the shear release posts 282 are allowed to fall onto a bottom of the corresponding staging cavity 281. The micro devices 105 may then be picked up by transfer heads 604 from the bottom of the corresponding staging cavities 281, as shown in FIG. 7E.

Figure 7F:
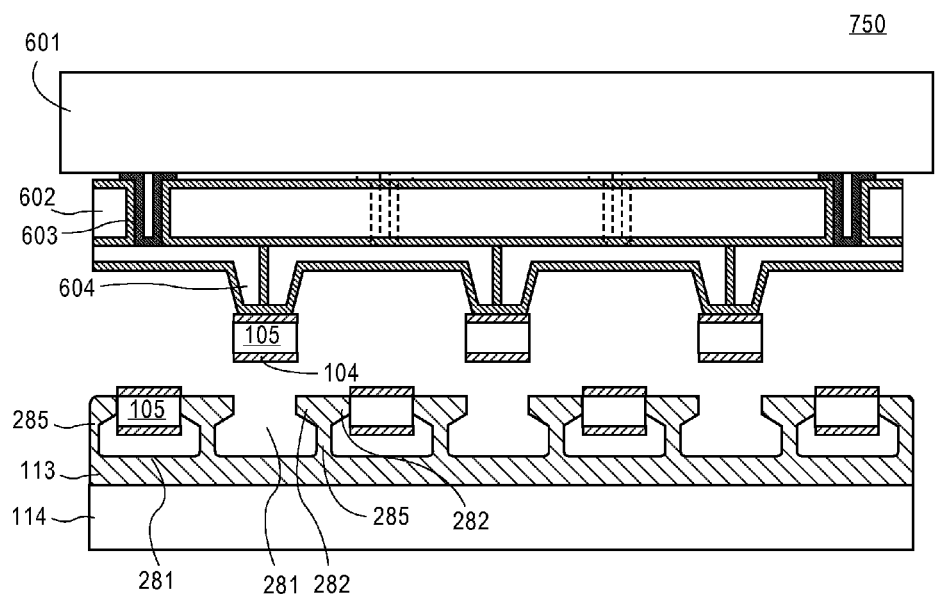

FIG. 7F is a cross-sectional side view 750 that illustrates the array of micro devices 105 being picked up by the array of transfer heads 604 according to one embodiment of the invention. The micro devices 105 not contacted by transfer heads 604 remain attached to the shear release posts 282 on carrier substrate 114. Following the pick up operation from the carrier substrate, the picked up micro devices can then be transferred and bonded to a receiving substrate with the transfer head assembly as described above.

In utilizing the various aspects of this invention, it would become apparent to one skilled in the art that combinations or variations of the above embodiments are possible for stabilizing an array of micro devices on a carrier substrate, and for transferring the array of micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A stabilization structure comprising:
a carrier substrate;
a stabilization layer on the carrier substrate, the stabilization layer including an array of staging cavities; and
an array of micro devices within the array of staging cavities, wherein each micro device is laterally attached to a shear release post laterally extending from a sidewall of a staging cavity.

2. The structure of claim 1, wherein each micro device is secured above a bottom surface of the staging cavity of the stabilization layer.

3. The structure of claim 1, wherein the stabilization layer is formed of a thermoset material.

4. The structure of claim 3, wherein the thermoset material includes benzocyclobutene (BCB).

5. The structure of claim 1, wherein each micro device is embedded in a sacrificial release layer.

6. The structure of claim 5, wherein the sacrificial release layer comprises an oxide material.

7. The structure of claim 1, wherein each micro device is a micro chip.

8. The structure of claim 1, wherein each micro device is a micro light emitting diode (LED) device.

9. The structure of claim 1, wherein each micro device has a maximum width of 1 μm-100 μm.

10. The structure of claim 9, wherein each micro device is attached to a shear release post with an attachment area having a height that is less than a height of the micro device.

11. The structure of claim 10, wherein the height of the attachment area of the micro device is up to 50% of the height of the micro device.

12. The structure of claim 5, wherein the micro devices are thicker than the sacrificial release layer.

13. The structure of claim 1, wherein the shear release post is formed axially between adjacent micro devices.

14. The structure of claim 1, wherein the shear release post is formed diagonally between adjacent micro devices.

* * * * *